(12) United States Patent
Liu et al.

(10) Patent No.: US 12,610,834 B2
(45) Date of Patent: Apr. 21, 2026

(54) SEMICONDUCTOR DEVICE PACKAGE STRUCTURE AND MANUFACTURING METHOD THEREOF

(71) Applicant: TAIWAN SEMICONDUCTOR MANUFACTURING COMPANY, LTD., Hsinchu (TW)

(72) Inventors: Tzuan-Horng Liu, Hsinchu (TW); Hao-Yi Tsai, Hsinchu (TW); Tsung-Yuan Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 548 days.

(21) Appl. No.: 18/098,987

(22) Filed: Jan. 19, 2023

(65) Prior Publication Data

US 2024/0178150 A1      May 30, 2024

Related U.S. Application Data

(60) Provisional application No. 63/428,901, filed on Nov. 30, 2022.

(51) Int. Cl.
H01L 23/538 (2006.01)
H01L 21/56 (2006.01)
(Continued)

(52) U.S. Cl.
CPC ........ H01L 23/5389 (2013.01); H01L 21/565 (2013.01); H01L 24/16 (2013.01);
(Continued)

(58) Field of Classification Search
CPC ......... H01L 2923/1434; H01L 25/0655; H01L 25/162; H01L 25/50; H01L 23/5389; H01L 23/5383; H01L 23/5384; H01L 23/5385; H01L 24/19; H01L 24/81; H01L 2224/73204; H01L 2224/32225; H01L 2224/16227; H01L 2221/68345; H01L 21/6835
See application file for complete search history.

(56) References Cited

U.S. PATENT DOCUMENTS

2018/0068978 A1*   3/2018   Jeng ......................... H01L 25/50
2019/0131273 A1*   5/2019   Chen ....................... H01L 25/16

* cited by examiner

*Primary Examiner* — Lawrence C Tynes, Jr.
(74) *Attorney, Agent, or Firm* — Birch, Stewart, Kolasch & Birch, LLP

(57)      ABSTRACT

A semiconductor device package structure is provided, including a redistribution structure, a first semiconductor device, a second semiconductor device, a bridge die, a first conductive bump, and a second conductive bump bumps, a third conductive bumps, and a first solder material. The first semiconductor device is disposed on a first side of the redistribution structure, the second semiconductor device and the bridge die are disposed on a second side opposite to the first side. The first conductive bump is disposed on the first semiconductor device, the second conductive bump is disposed on the second side of the redistribution structure and the third conductive bump is disposed on the second semiconductor device. The first solder material is electrically connected between the second conductive bump and the third conductive bump, and the redistribution structure is electrically connected between the first conductive bump and the second conductive bump.

20 Claims, 46 Drawing Sheets

(51) Int. Cl.
    *H01L 23/00*         (2006.01)
    *H01L 25/16*         (2023.01)
    *H10B 80/00*         (2023.01)

(52) U.S. Cl.
    CPC .............. *H01L 24/32* (2013.01); *H01L 24/73*
        (2013.01); *H01L 25/162* (2013.01); *H10B*
        *80/00* (2023.02); *H01L 2224/16227* (2013.01);
        *H01L 2224/32225* (2013.01); *H01L*
        *2224/73204* (2013.01); *H01L 2924/1434*
        (2013.01)

100

114 116 118 114 116 119

120

100

100

SEMICONDUCTOR DEVICE PACKAGE STRUCTURE AND MANUFACTURING METHOD THEREOF

PRIORITY CLAIM AND CROSS-REFERENCE

This application claims the benefit of U.S. provisional application Ser. No. 63/428,901, filed Nov. 30, 2022, the subject matter of which is incorporated herein by reference.

BACKGROUND

The semiconductor industry has experienced rapid growth due to the continuous increase in the integration density of various electronic components (e.g., transistors, diodes, resistors, capacitors, etc.). To a large extent, the increase in integration density results from the continued reduction in minimum feature size, which enables more devices to be integrated into a given area. As the need to shrink electronic devices has grown, the need for smaller and more creative semiconductor die packaging techniques has emerged. An example of such a packaging system is Package-on-Package (PoP) technology. In a PoP device, the top semiconductor package is stacked on top of the bottom semiconductor package to provide high integration and high device density. PoP technology generally enables the production of semiconductor devices with enhanced functionality and a small footprint on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
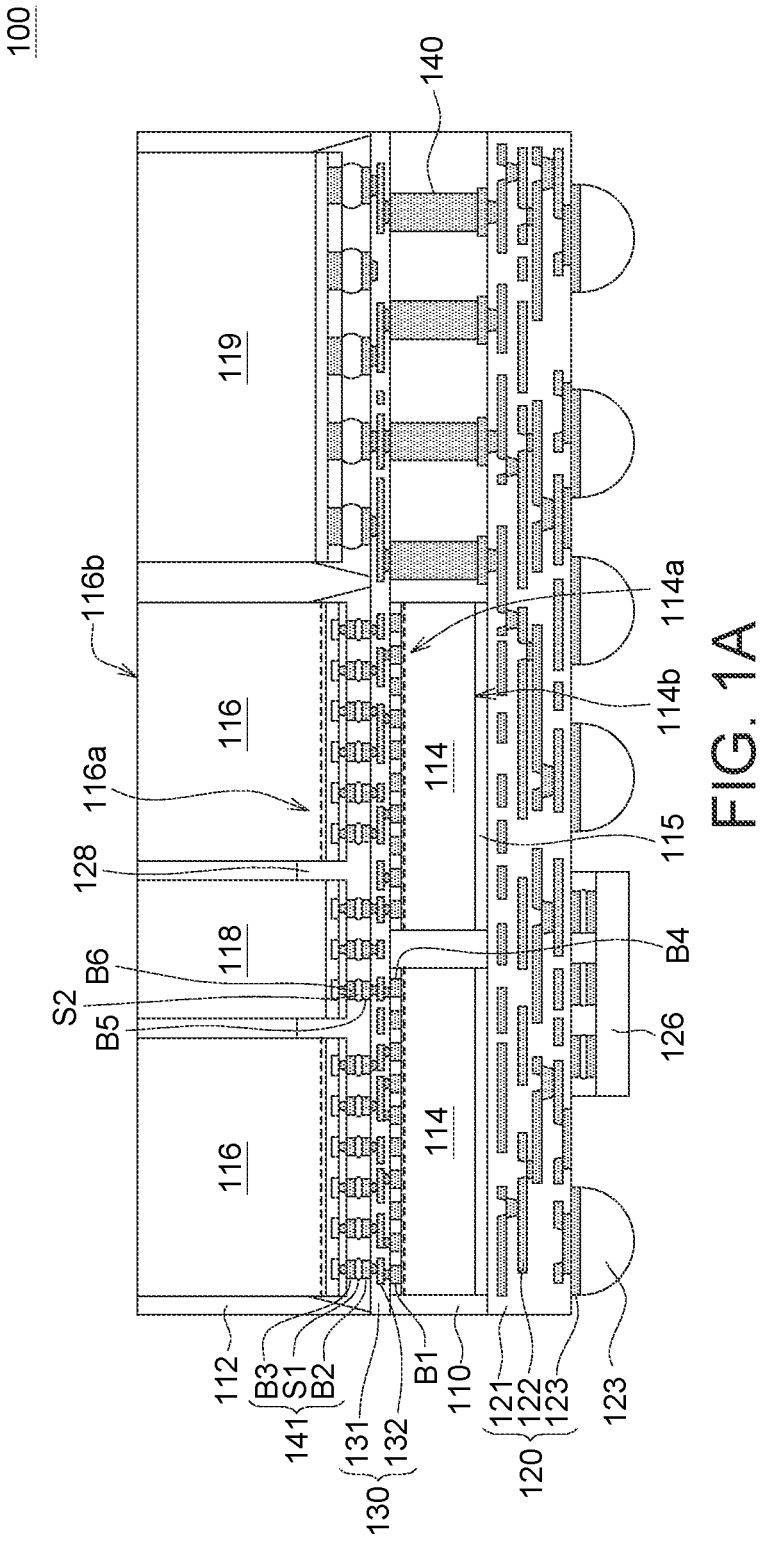
FIGS. 1A and 1B illustrate a side cross-sectional view and a plan view of a semiconductor device package structure according to a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
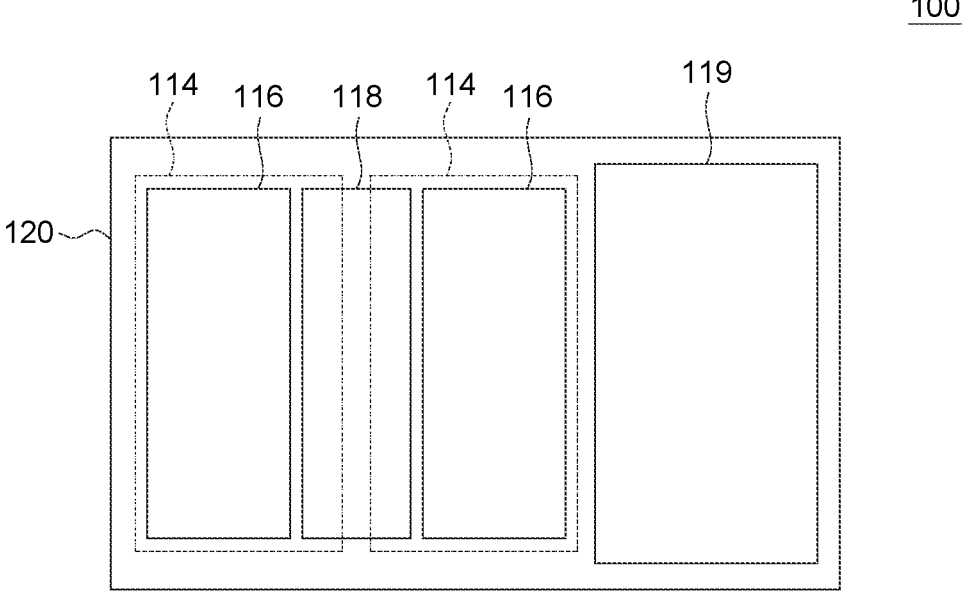

Please refer to FIGS. 1A and 1B, which illustrate a side cross-sectional view and a plan view of a semiconductor device package structure 100 according to a first embodiment of the present disclosure. The semiconductor device package structure 100 includes a first filling layer 110, a second filling layer 112, a first redistribution structure 120, a second redistribution structure 130, a first semiconductor device 114, a second semiconductor device 116, a first conductive bump B1, a second conductive bump B2, a third conductive bump B3, a fourth conductive bump B4, a fifth conductive bump B5, a sixth conductive bump B6, a first solder material S1 and a second solder material S2. The first redistribution structure 120, the first filling layer 110, the second redistribution structure 130 and the second filling layer 112 are sequentially stacked from bottom to top. The first redistribution structure 120 and the first filling layer 110 are disposed on a first side of the second redistribution structure 130, the second filling layer 112 is disposed on a second side of the second redistribution structure 130, and the first side is opposite to the second side. The second redistribution structure 130 is disposed between the first filling layer 110 and the second filling layer 112. That is, the first filling layer 110 and the second filling layer 112 are located on opposite sides of the second redistribution structure 130.

According to an embodiment, a plurality of semiconductor devices 114, 116, 118 (e.g., system-on-chip (SoC) or bridge dies) are incorporated into the same package structure and are electrically connected to each other. In addition, the semiconductor devices 114 and 116, the bridge dies 118, the through mold via structure 140, the memory device 119 and the independent passive device (IPD) 126 are integrated into the same package structure to form a 3D system-on-integrated chips (SoIC) package structure.

The semiconductor device package structure 100 of the present disclosure can be achieved by using a fan-out wafer-level packaging (FOWLP) technology. The FOWLP is an improvement on wafer-level packaging (WLP) and can provide more external connections for silicon dies. The silicon die is embedded in epoxy molding compound (EMC), and then a high-density redistribution structures (RDL) and copper bumps are constructed on the semiconductor surface to be used as die bonding structures to form a multi-level reconstituted package.

The first redistribution structure 120 is located on a first side (e.g., lower side) of the first filling layer 110, and the second redistribution structure 130 is located on a second side (e.g., upper side) of the first filling layer 110. The through-mold via structure 140 passes through the first filling layer 110 and connects with the first redistribution structure 120 and the second redistribution structure 130. In addition, the first filling layer 110 surrounds the first semiconductor device 114 and the through-mold via structure 140, the second filling layer 112 surrounds the second semiconductor device 116, the bridge die 118 and the memory device 119.

The first filling layer 110 includes, for example, an epoxy molding compound (EMC), and the EMC is a compound containing epoxy resin, and the EMC can be hardened (i.e., cured) to provide the function of a dielectric material with sufficient hardness and mechanical strength. EMC may include epoxy resins, curing agents, silica (as filler material) and other additives. EMC can be available in liquid form or solid form depending on viscosity and fluidity. Liquid EMC generally provides better handling, good fluidity, fewer voids, better filling and fewer flow marks. Solid EMC generally provides less cure shrinkage, better stand-off, and less die drift. High filler content in EMC (e.g., 85% by weight) reduces molding time, molding shrinkage, and molding warpage. Uniform filler size distribution in EMC can reduce flow marks and enhances flow. The curing temperature of EMC can be lower than the release (peel) temperature of the die attach film (DAF) 115.

The first redistribution structure 120 may include a first redistribution dielectric layer 121, a first redistribution wiring interconnect 122 and a first bonding pad 123. The first redistribution dielectric layer 121 includes a dielectric polymer material, such as polyimide (PI), benzocyclobutene (BCB) or polybenzobisoxazole (PBO). Each of the first redistribution dielectric layers 121 may be formed by spin coating and drying the dielectric polymer material. The thickness of each first redistribution dielectric layer 121 may be in the range of 2 microns to 40 microns (e.g., 4 microns to 20 microns). The photoresist layer can be applied over each first redistribution dielectric layer 121 and patterned using an etching process (e.g., anisotropic etching process) to transfer the pattern in the photoresist layer into the first redistribution dielectric layer 121. Subsequently, the photoresist layer can be removed by ashing, for example. Additionally, the metal fill material for the first redistribution wiring interconnects 122 may include copper, nickel, or both copper and nickel. The thickness of the metal fill material deposited to form each of first redistribution wiring interconnects 122 may be in the range of 2 microns to 40 microns (e.g., 4 microns to 10 microns), but smaller or greater thicknesses may also be used. The total number of wiring levels in the first redistribution structure 120 may range from 1 to 10.

The structure and manufacturing method of the second redistribution structure 130 are similar to that of the first redistribution structure 120, which has been illustrated in the above disclosure. The second redistribution structure 130 may include a second redistribution dielectric layer 131, a second redistribution wiring interconnect 132 and a second conductive bump B2. The second redistribution dielectric layer 131 includes a dielectric polymer material, such as polyimide (PI), benzocyclobutene (BCB), or polybenzobisoxazole (PBO). The metal fill material for the second redistribution wiring interconnect 132 may include copper, nickel, or both copper and nickel. The metal for the second conductive bump B2 may include copper. Additionally, the second conductive bump B2 may be configured for die bonding and may have a thickness in the range of 25 microns to 50 microns.

The first bonding pads 123 may have a rectangular, rounded rectangular or circular horizontal cross-sectional shape, and the thickness of the first bonding pads 123 may be in the range of 5 microns to 50 microns. In addition, the soldering materials 124 (e.g., solder balls) can be formed on the first bonding pads 123, and the semiconductor device package structure 100 and a carrier 129 (e.g., a silicon substrate or a glass epoxy-based circuit board, etc.) are electrically connected to each other through the soldering materials 124.

In addition, soldering materials 124 may be ball grid array (BGA) connectors, solder balls, metal pillars, controlled collapse chip connections (C4) bumps, bumps formed by electroless nickel-electroless palladium-immersion gold (ENEPIG) technology, or the like.

The through-mold via structure 140 is, for example, a combination of a metal nitride liner material (e.g., TiN, TaN, WN, or a combination thereof) and a metal filler material (e.g., W, Mo, Co, Ru, Cu, or any other transition metal). Additionally, at least underfill material 128 (see FIGS. 1A to 4A) is formed around each joined array of solder materials 124, S1 and S2, such as by injecting underfill around the array of solder materials 124, S1 and S2 after reflowing the solder materials 124, S1 and S2, to protect the IPD 126 and the solder materials 124, S1 and S2.

Referring to FIG. 1A, the first semiconductor device 114 includes an active side 114a and a backside 114b, the active side 114a is provided with a plurality of devices, the backside 114b is provided with a DAF 115, and the first semiconductor device 114 is disposed on the first redistribution structure 120 by the DAF 115. The first conductive bump B1 is disposed on the active side 114a of the first semiconductor device 114, and the second conductive bump B2 is disposed on one side (e.g., the upper side) of the second redistribution structure 130. In addition, the second semiconductor device 116 includes an active side 116a and a backside 116b, the active side 116a is provided with a plurality of devices, and the third conductive bump B3 is disposed on the active side 116a of the second semiconductor device 116 and is opposite to the second conductive bump B2. The first solder material S1 is electrically connected between the second conductive bump B2 and the third conductive bump B3, and the second redistribution wiring interconnect 132 of the second redistribution structure 130 is electrically connected between the first conductive bump B1 and the second conductive bump B2. The first conductive bump B1, the second conductive bump B2, and the third conductive bump B3 are, for example, copper bumps, the critical dimension (CD) of the copper bumps is 10-15 μm, the pitch is 25 μm, and the first solder material S1 is, for example, tin. Copper bumps are used as die-bonding structures 141 to form a high-density of contacts. Similarly, in FIG. 2A to FIG. 14A, copper bumps are used as the die bonding structure 141.

Referring to FIG. 1A, the bridge die 118 also uses copper bumps as the die bonding structure. The bridge die 118 may be a die without active/passive devices, and provides an interconnect structure between the two first semiconductor devices 114. According to an embodiment, the semiconductor device package structure 100 includes a fourth conductive bump B4, a fifth conductive bump B5, a sixth conductive bump B6, and a second solder material S2. The fourth conductive bump B4 is disposed on the first semiconductor device 114, the fifth conductive bump B5 is disposed on one side (e.g., the upper side) of the second redistribution structure 130, and the sixth conductive bump B6 is disposed on the bridge die 118. The sixth conductive bump B6 is disposed opposite to the fifth conductive bump B5. The second solder material S2 is electrically connected between the fifth conductive bump B5 and the sixth conductive bump B6, and the second redistribution wiring interconnect 132 of the second redistribution structure 130 is electrically connected between the fourth conductive bump B4 and the fifth conductive bump B5. The fourth conductive bump B4, the fifth conductive bump B5 and the sixth conductive bump B6 are, for example, copper bumps, the CD of the copper bumps is 10-15 μm, the pitch is 25 μm, and the first soldering material S1 is, for example, tin. Copper bumps are used as die-bonding structures 141 to form a high density of contacts. Similarly, in FIG. 2A to FIG. 14A, copper bumps of bridge die 118 are used as the die bonding structure 141.

Referring to the plan view shown in FIG. 1B, the bridge die 118 can be disposed between two second semiconductor devices 116, and the vertical projection area of the bridge die 118 and the vertical projection areas of adjacent two first semiconductor devices 114 are partially overlapped. In addition, the size of the first semiconductor device 114 is larger than that of the second semiconductor device 116, and the vertical projection area of the first semiconductor device 114 completely overlaps with the vertical projection area of the second semiconductor device 116. Similarly, in FIG. 3B, FIG. 5B, FIG. 10B, and FIG. 12B, an arrangement in which the size of the first semiconductor device 114 is larger than that of the second semiconductor device 116 is also adopted.

Figure 2A:
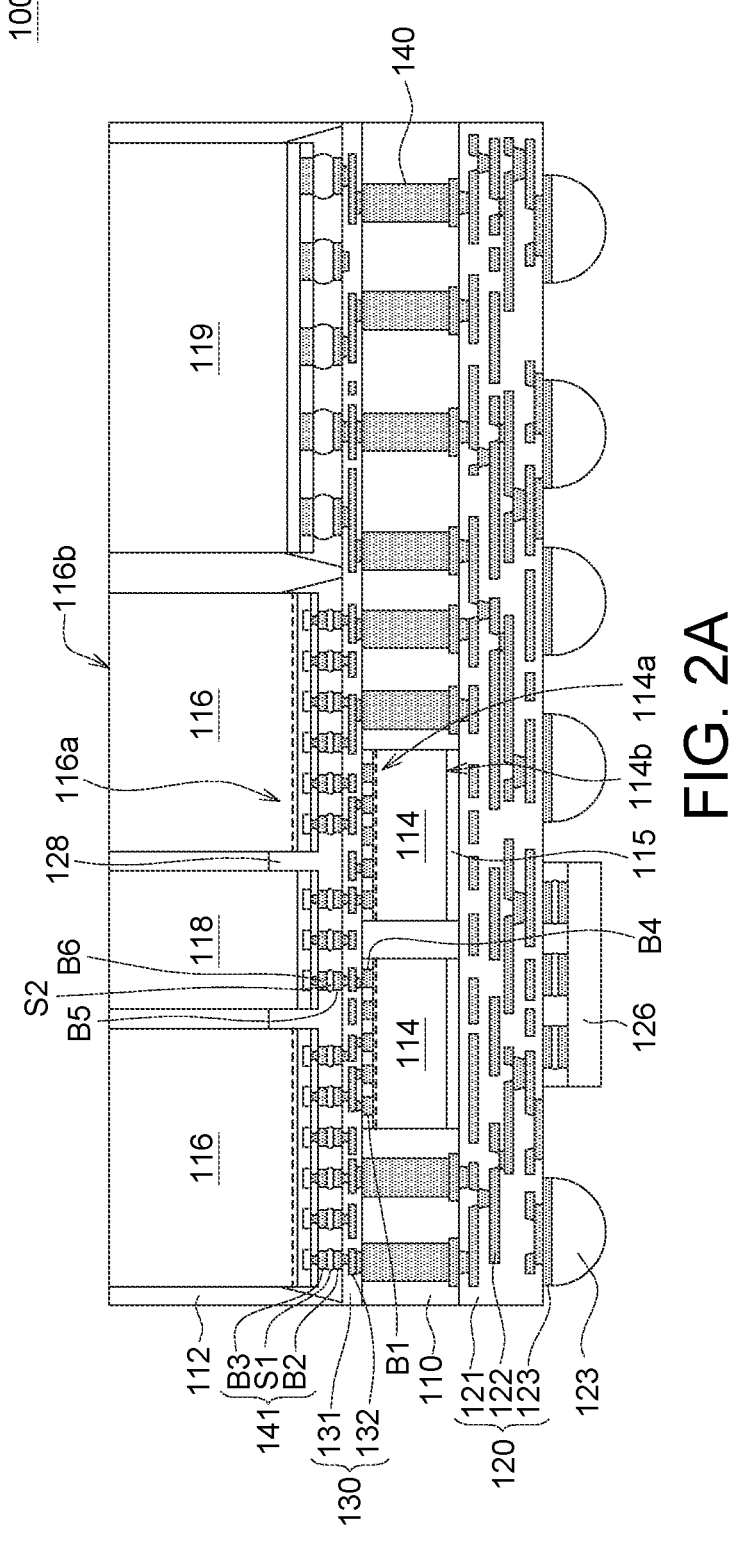
FIGS. 2A and 2B illustrate a side cross-sectional view and a plan view of a semiconductor device package structure according to a second embodiment of the present disclosure.
Figure 2B:
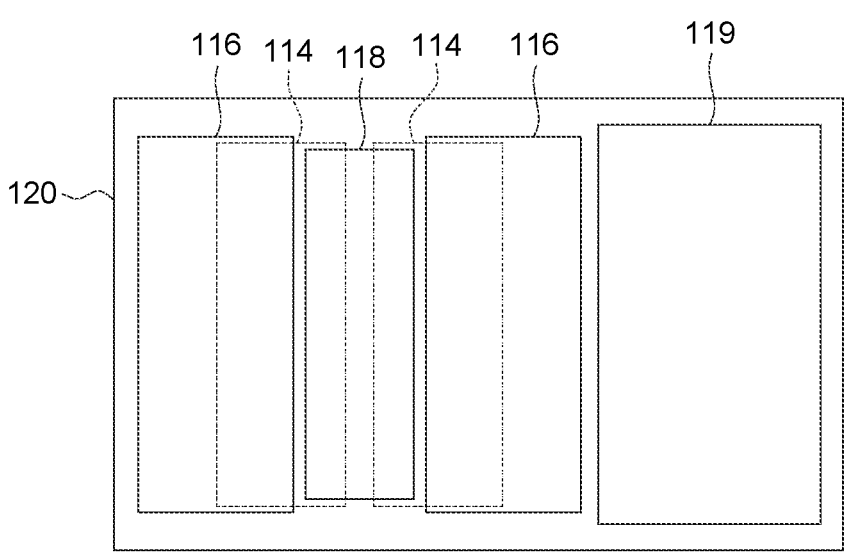
Figure 3A:
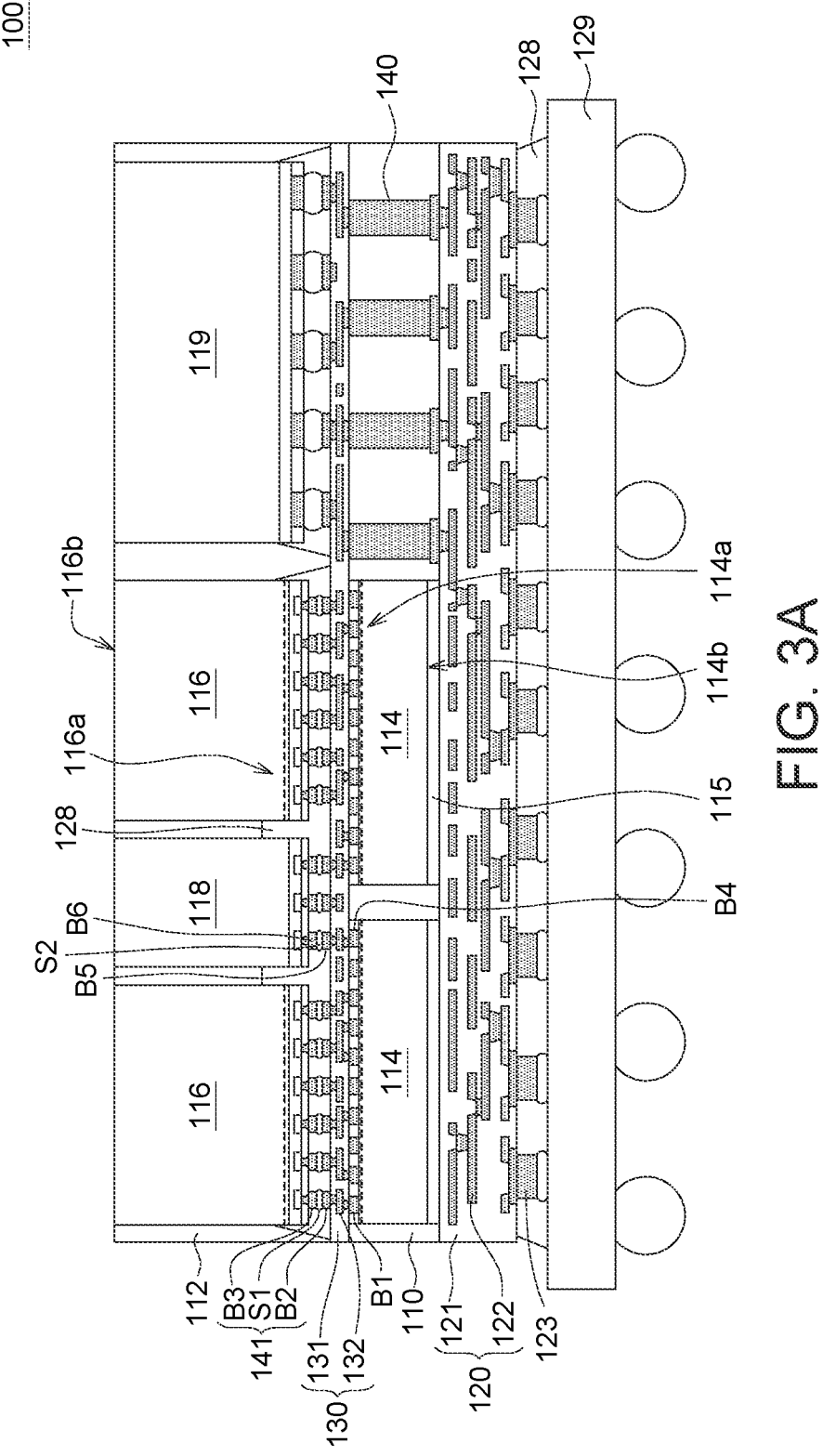
FIGS. 3A and 3B illustrate a side cross-sectional view and a plan view of a semiconductor device package structure according to a third embodiment of the present disclosure.
Figure 3B:
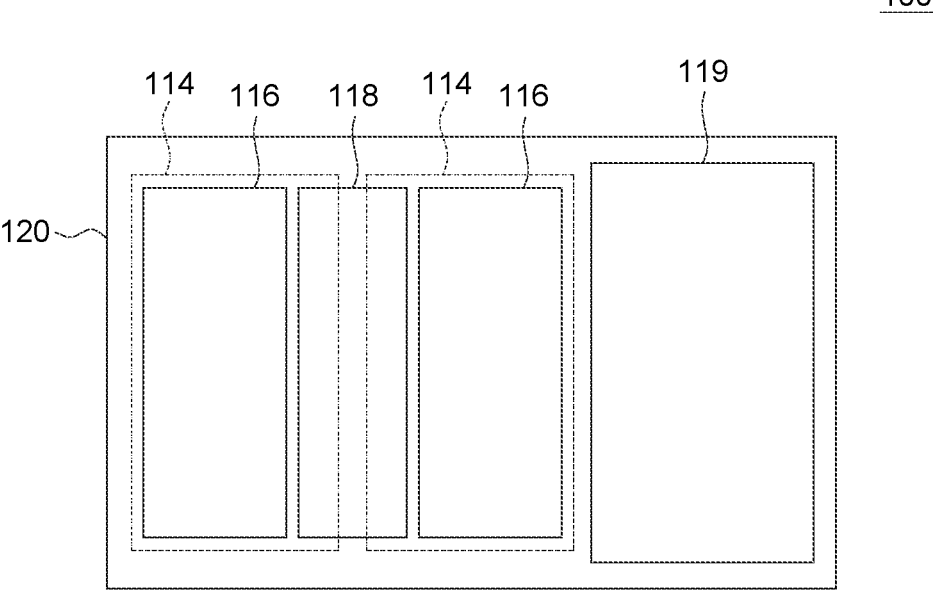
Figure 4A:
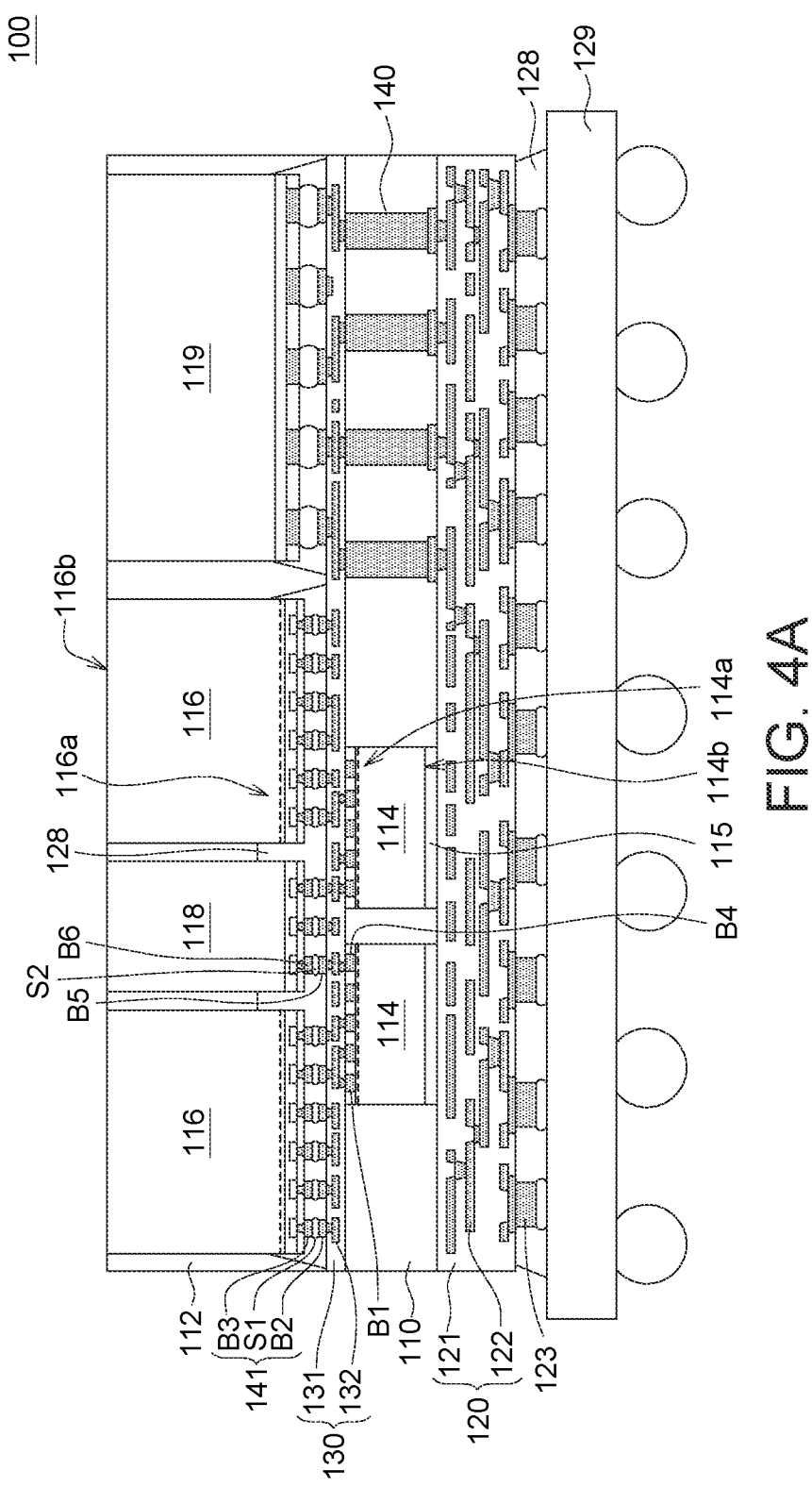
FIGS. 4A and 4B illustrate a side cross-sectional view and a plan view of a semiconductor device package structure according to a fourth embodiment of the present disclosure.
Figure 4B:
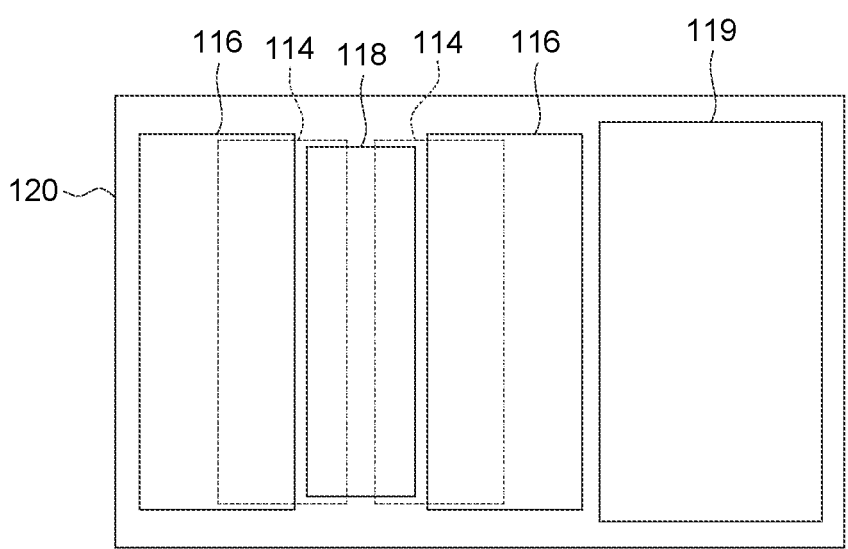
Figure 5A:
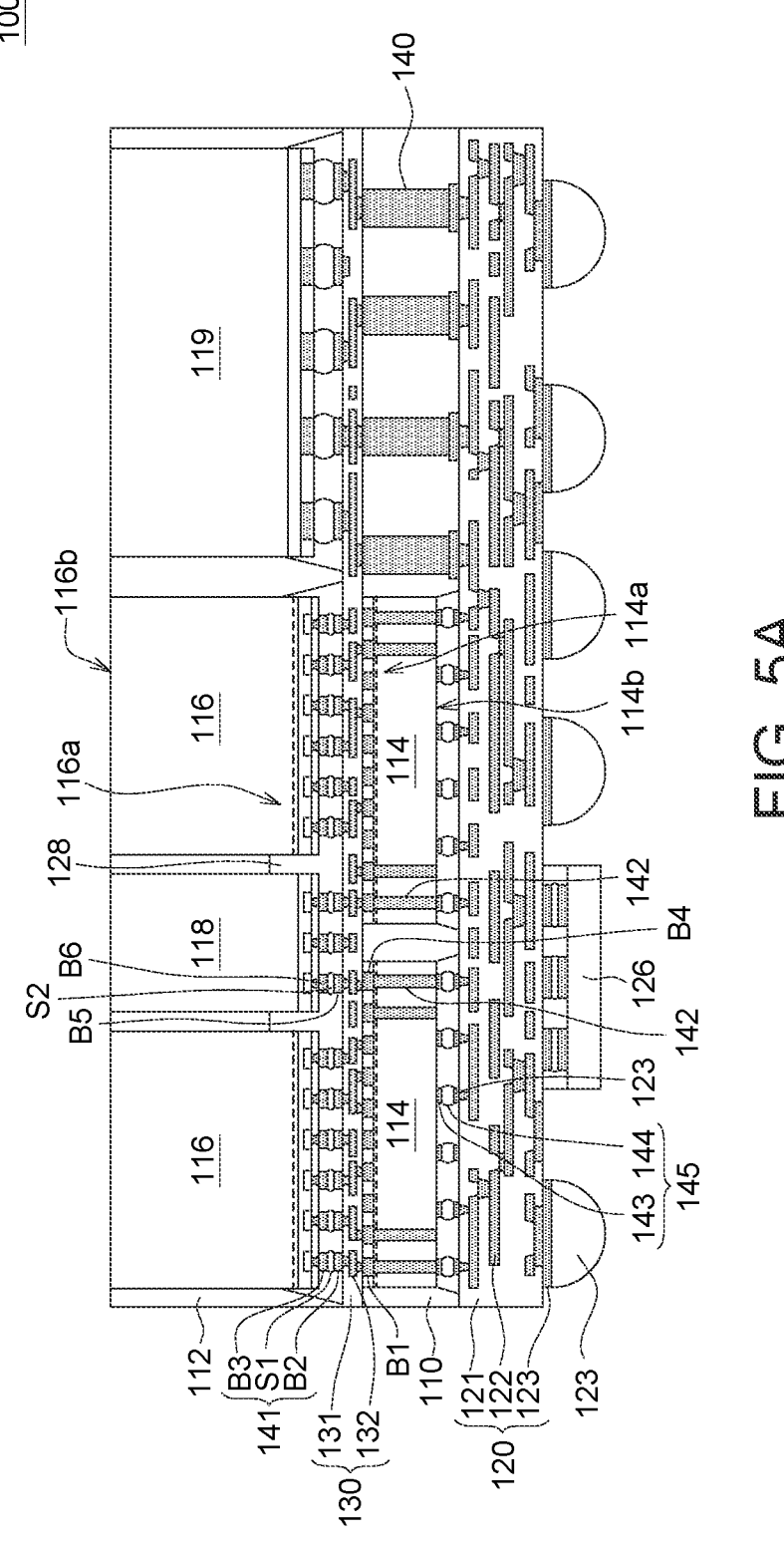
FIGS. 5A and 5B illustrate a side cross-sectional view and a plan view of a semiconductor device package structure according to a fifth embodiment of the present disclosure.
Figure 5B:
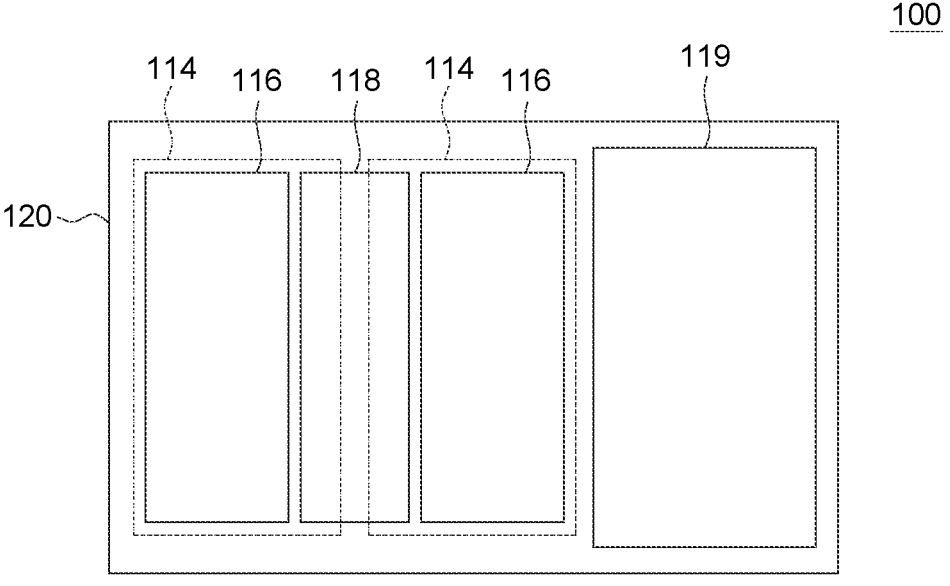
Figure 6A:
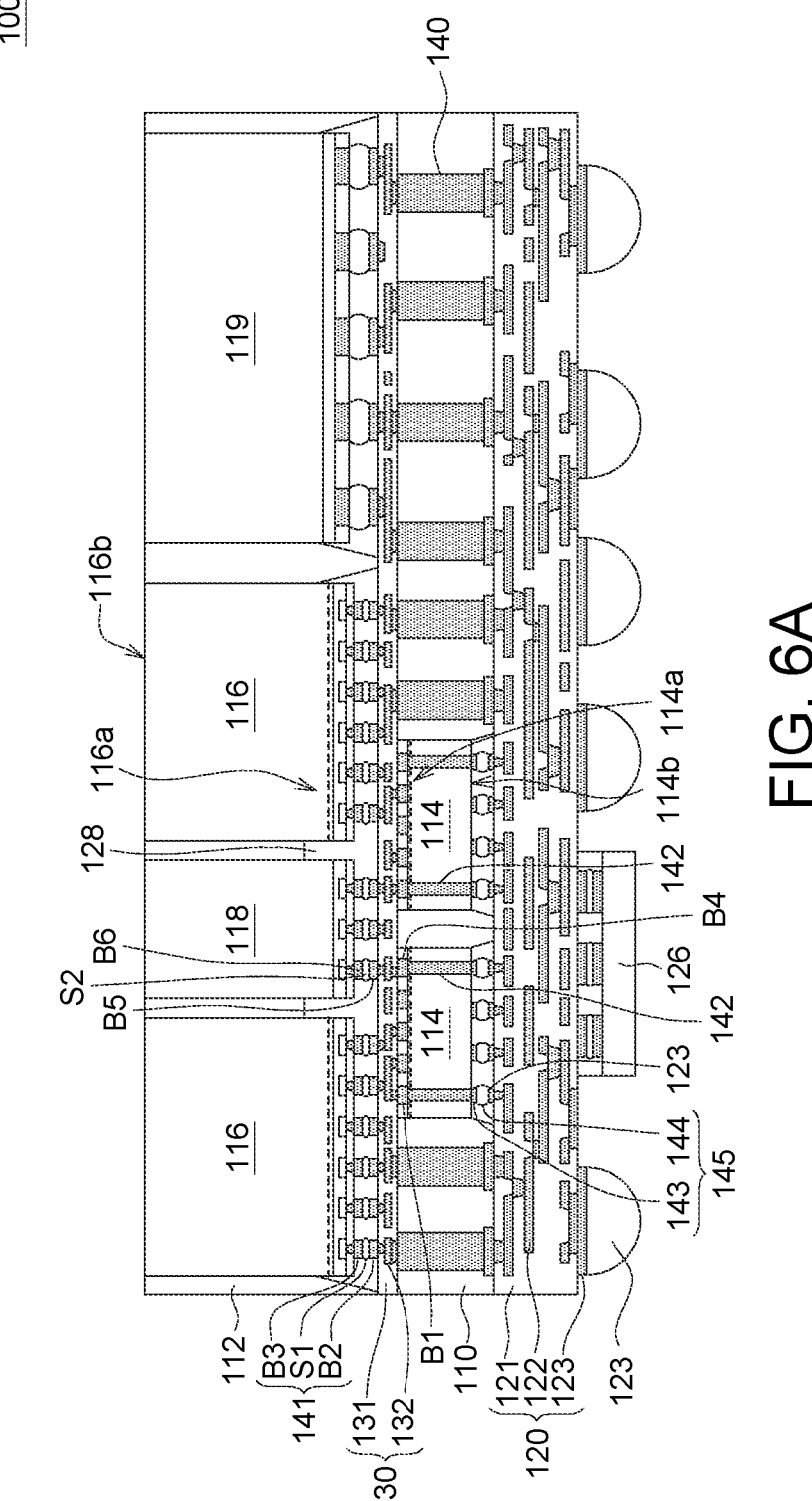
FIGS. 6A and 6B illustrate a side cross-sectional view and a plan view of a semiconductor device package structure according to a sixth embodiment of the present disclosure.
Figure 6B:
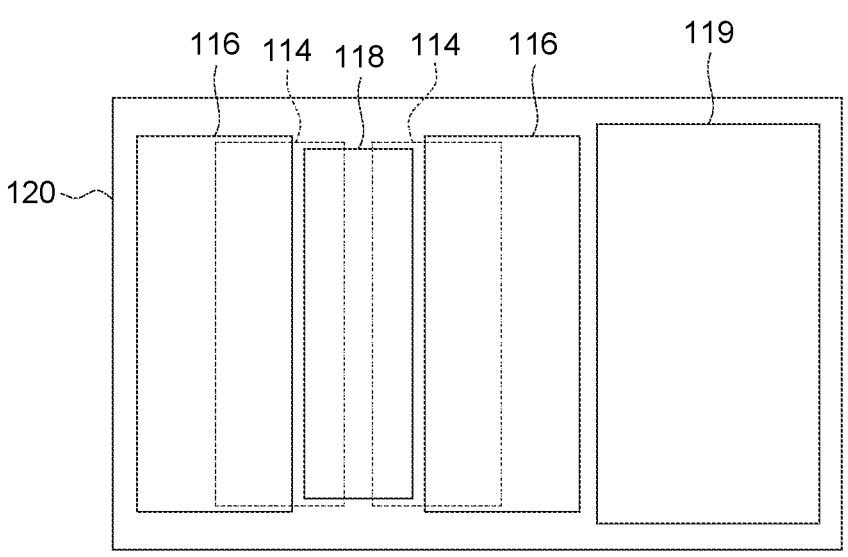
Figure 7A:
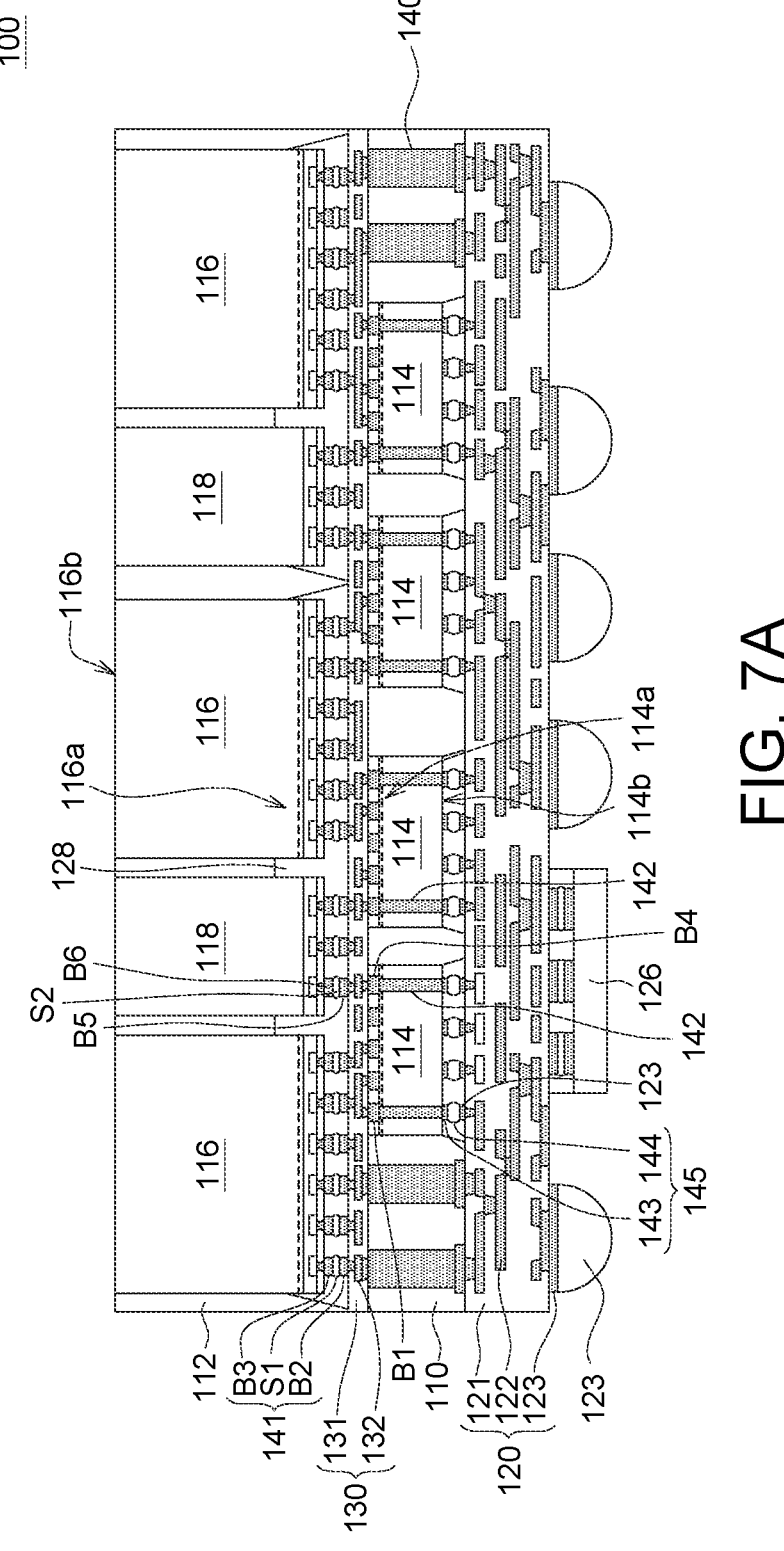
FIGS. 7A and 7B are a side cross-sectional view and a plan view of a semiconductor device package structure according to a seventh embodiment of the present disclosure.
Figure 7B:
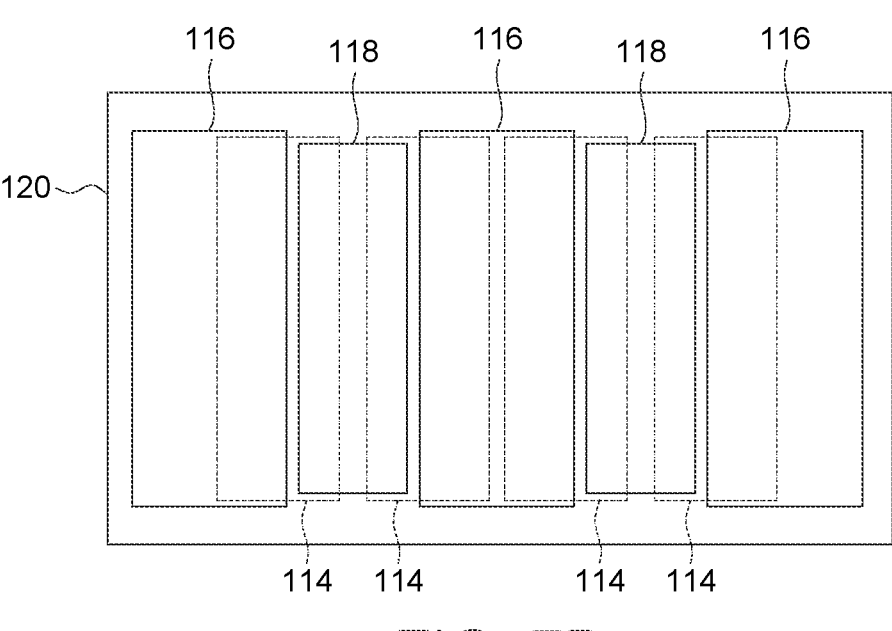

Referring to the plan view shown in FIG. 2B, the bridge die 118 can be disposed between two second semiconductor devices 116, and the vertical projection area of the bridge die 118 and the vertical projection areas of adjacent two first semiconductor devices 114 are partially overlapped. In addition, the size of the first semiconductor device 114 is smaller than that of the second semiconductor device 116, and the vertical projection area of the first semiconductor device 114 and the vertical projection area of the second semiconductor device 116 are partially overlapped. Similarly, in FIGS. 2B, 4B, 6B, 7B, 8B, 9B, 11B, 13B and 14B, an arrangement in which the size of the second semiconductor device 116 is larger than that of the semiconductor device 114 is also adopted.

Referring to FIGS. 1A to 8A, the active side 114a of the first semiconductor device 114 and the active side 116a of the second semiconductor device 116 are arranged in a face-to-face manner. In FIGS. 9A to 14A, the back surface 114b of the first semiconductor device 114 and the active side 116a of the second semiconductor device 116 are arranged in a face-to-face manner. In addition, in FIG. 5A, FIG. 6A, FIG. 7A, and FIG. 8A, the active side 114a of the first semiconductor device 114 is disposed upward, and the first semiconductor device 114 may further include a plurality of TSV (through silicon via) structures 142 and a plurality of die bonding structures 145 connected between the TSV structures 142 and the first redistribution structure 120, which are located in the overlapping area of the vertical projection area of the first semiconductor device 114 and the vertical projection area of the second semiconductor device 116 and/or in the overlapping area of the vertical projection area of the first semiconductor device 114 and the vertical projection area of the bridge die 118, the TSV structures 142 pass through the first semiconductor device 114, the CD of TSV structures 142 is 4.5 μm, the pitch is 25 μm, the die-bonding structures 145 are located on the backside 114b of the first semiconductor device 114, and the micro-bumps 143 of the die-bonding structures 145 can be connected to the bonding pads of the first redistribution structure 120 through soldering materials 144 (such as solder balls). The micro-bumps 143 are copper bumps, for example, CD is 10-15 μm, and pitch is 25 μm. Therefore, the second semiconductor device 116 and the bridge die 118 can be electrically connected to the first redistribution structure 120 through the TSV structures 142 to reduce signal transmission paths.

In FIGS. 9A to 14A, the active side 114a of the first semiconductor device 114 is disposed downward, and the first semiconductor device 114 may further include a plurality of TSV structures 142 and a plurality of die bonding structures 145 connected between the TSV structures 142 and the first redistribution structure 120, and the die bonding structures 145 are located on the active side 114a of the first semiconductor device 114. The micro-bumps 143 of the die-bonding structures 145 can be connected to the bonding pads (first conductive bumps B1) of the first redistribution structure 120 through soldering materials 144 (e.g., solder balls). The micro-bumps 143 are copper bumps, for example, CD is 10-15 μm, and pitch is 25 μm. Therefore, the second semiconductor device 116 and the bridge die 118 can be electrically connected to the first redistribution structure 120 through the TSV structures 142 to reduce signal transmission paths.

Figure 8A:
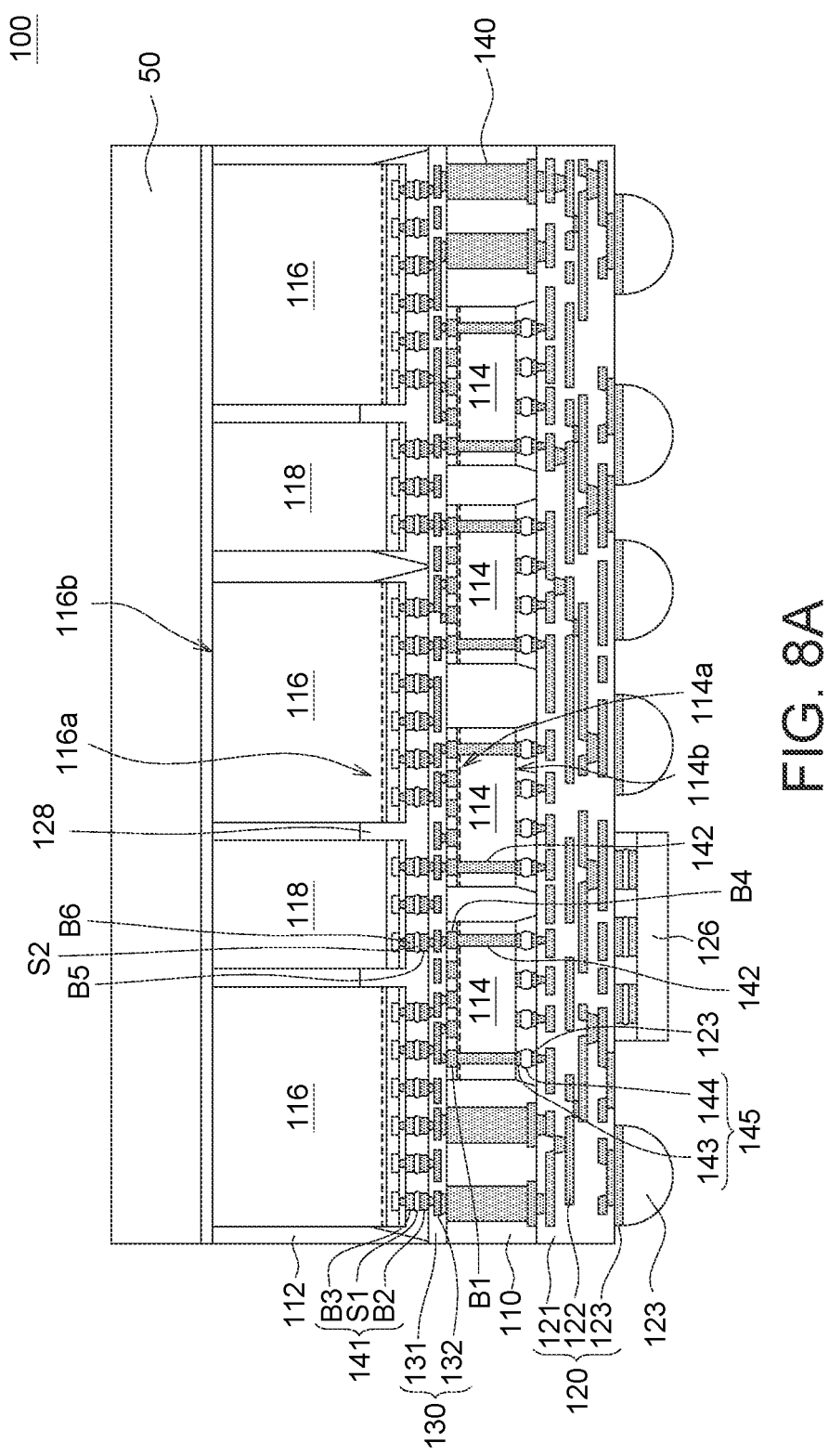
FIGS. 8A and 8B illustrate a side cross-sectional view and a plan view of a semiconductor device package structure according to an eighth embodiment of the present disclosure.
Figure 8B:
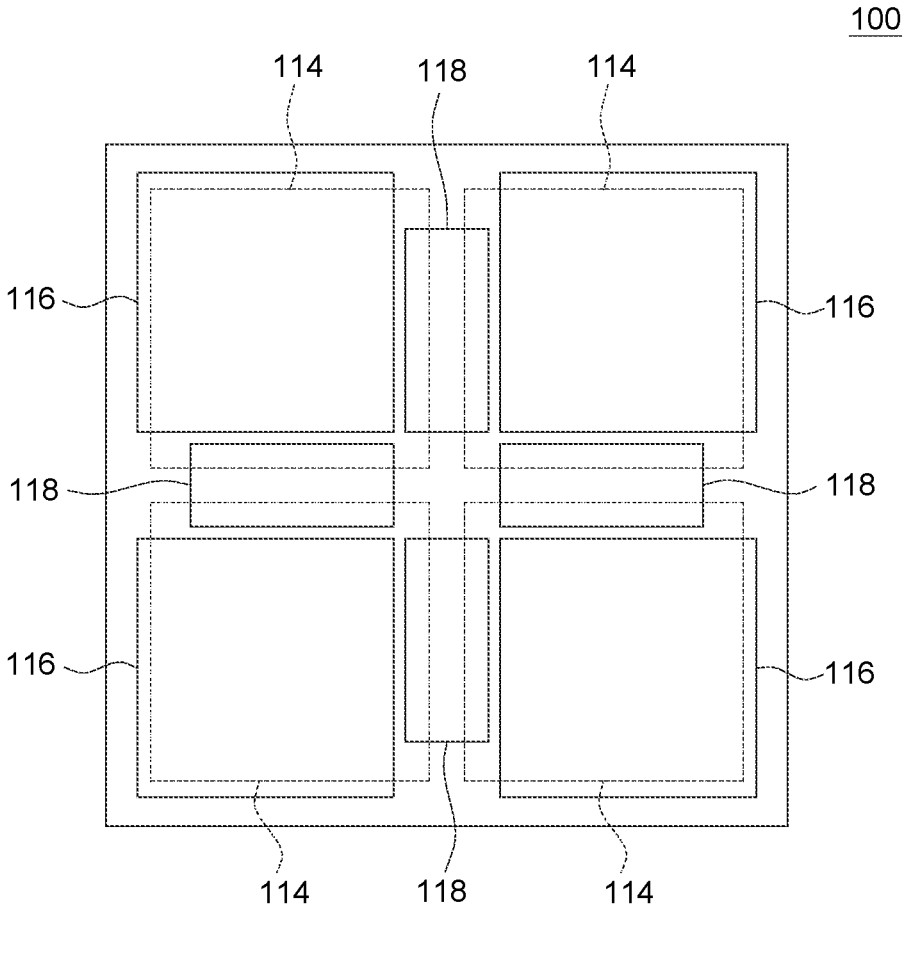
Figure 9A:
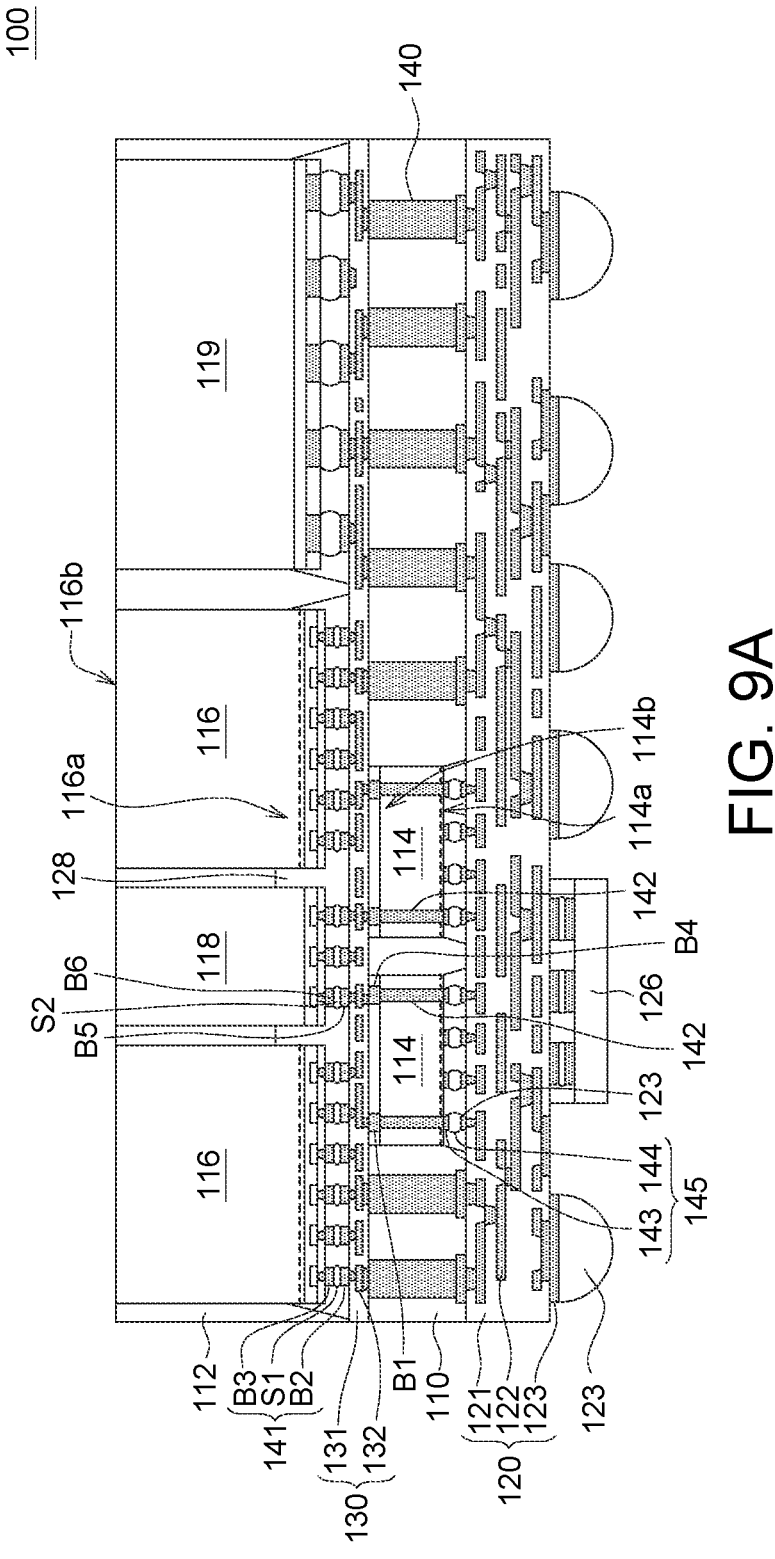
FIGS. 9A and 9B are a side cross-sectional view and a plan view of a semiconductor device package structure according to a ninth embodiment of the present disclosure.
Figure 9B:
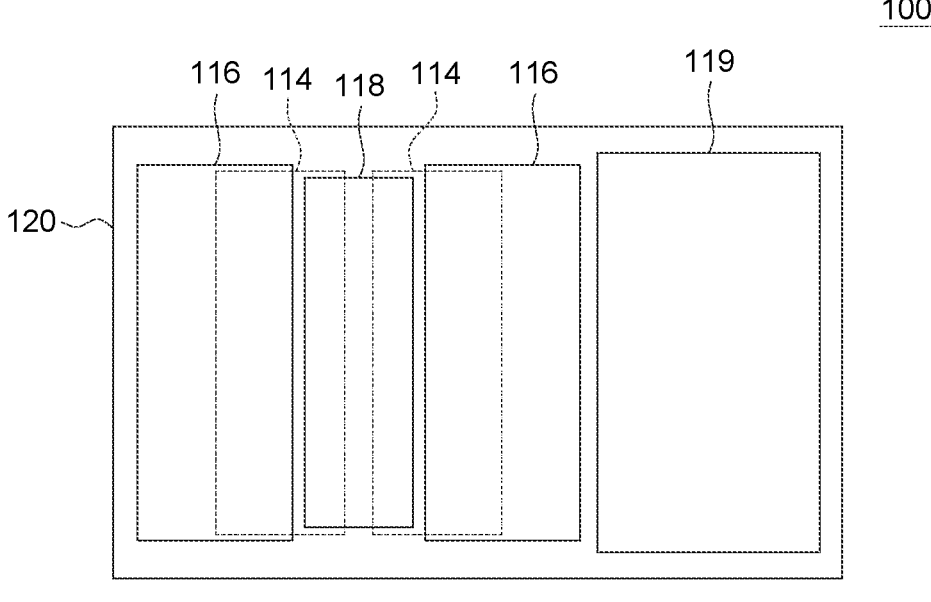
Figure 10A:
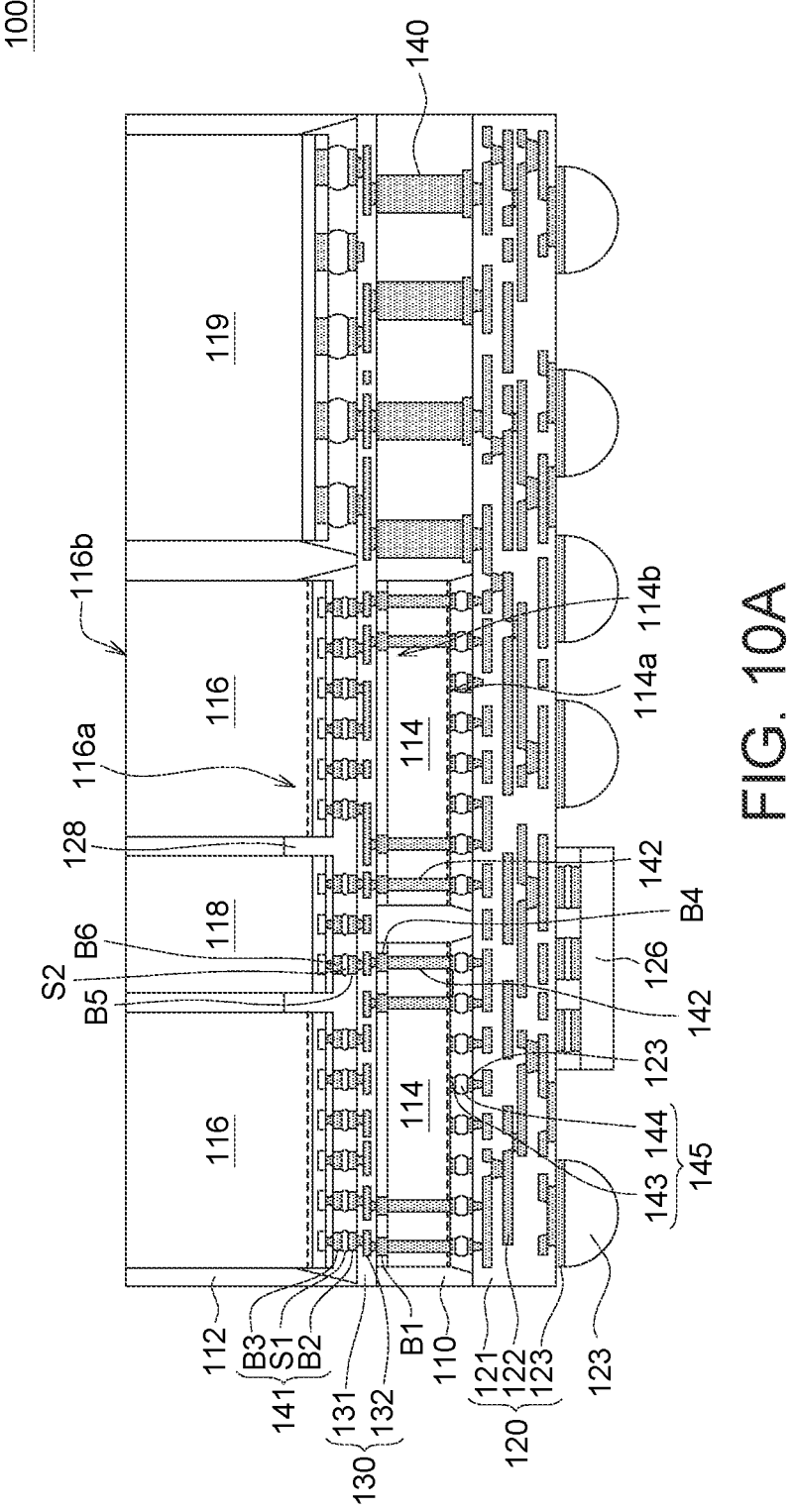
FIGS. 10A and 10B are a side cross-sectional view and a plan view of a semiconductor device package structure according to a tenth embodiment of the present disclosure.
Figure 10B:
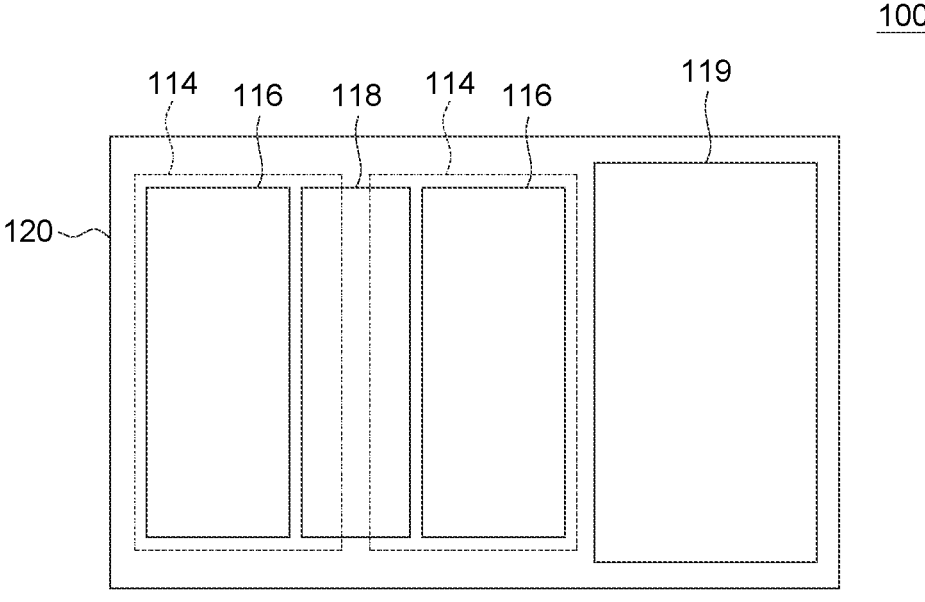
Figure 11A:
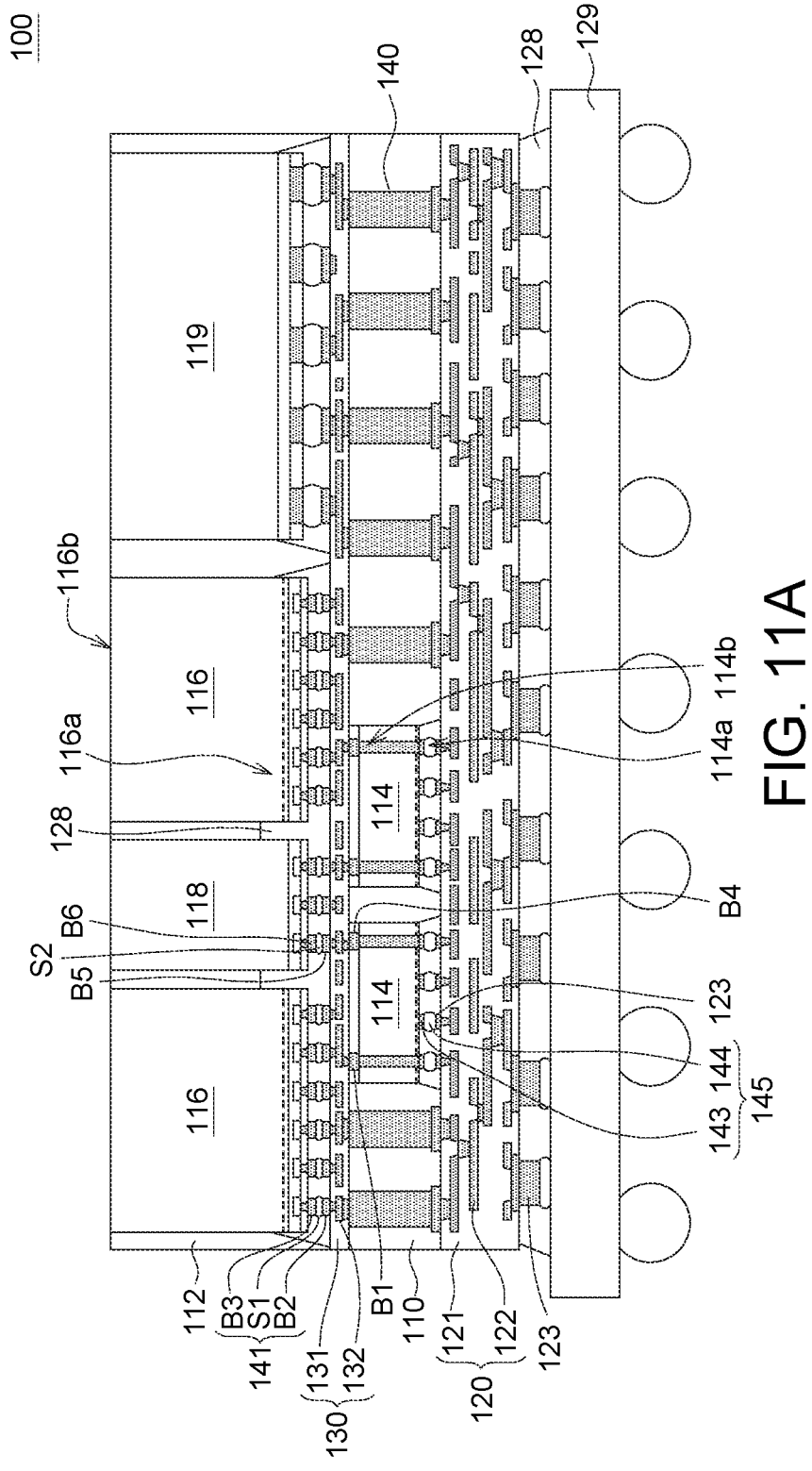
FIGS. 11A and 11B are a side cross-sectional view and a plan view of a semiconductor device package structure according to an eleventh embodiment of the present disclosure.
Figure 11B:
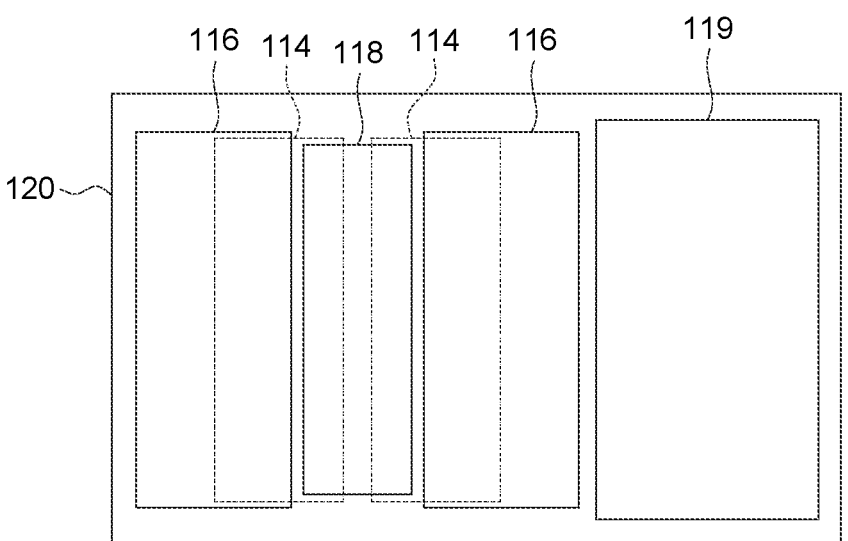
Figure 12A:
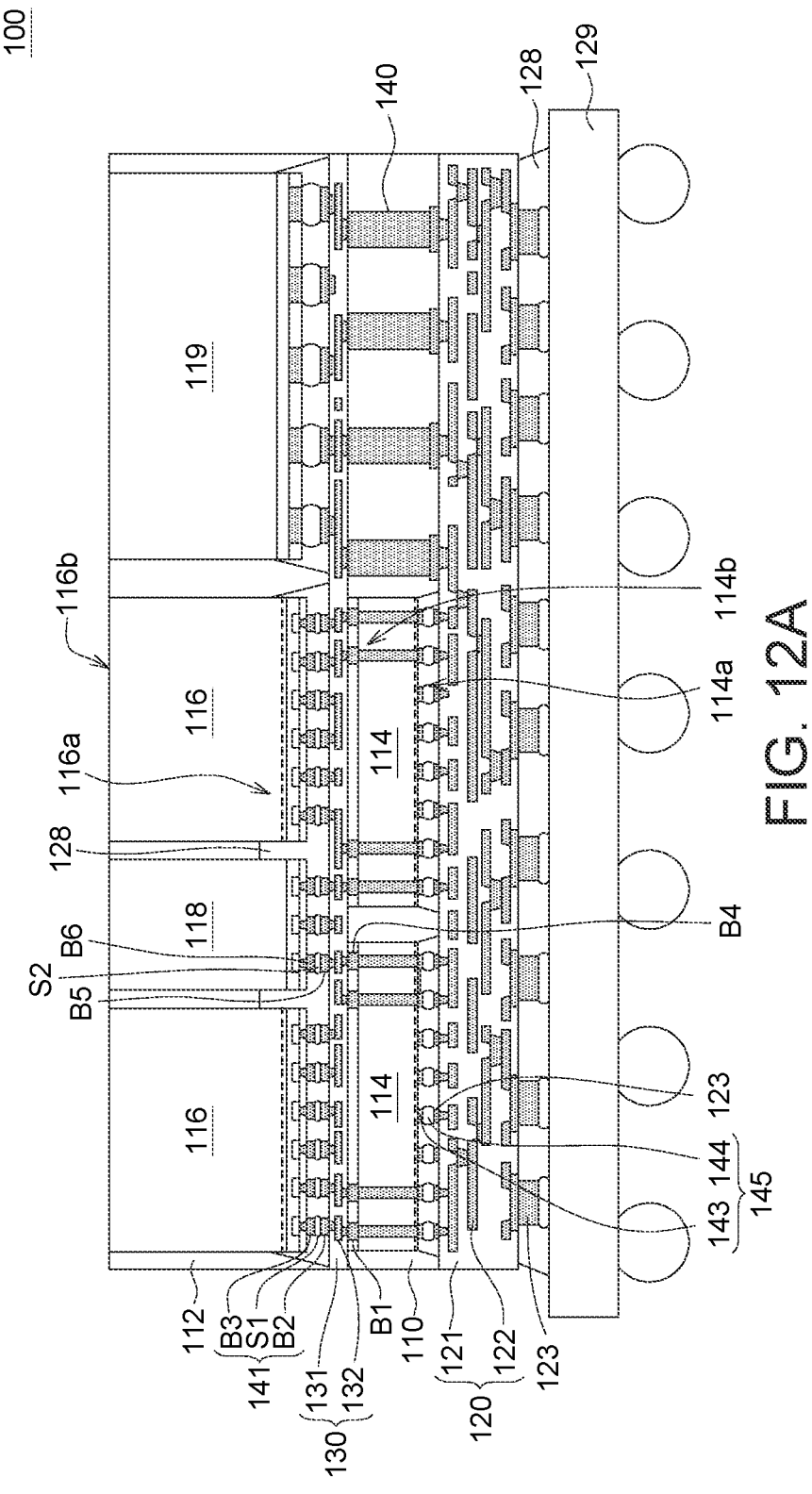
FIGS. 12A and 12B illustrate a side cross-sectional view and a plan view of a semiconductor device package structure according to a twelfth embodiment of the present disclosure.
Figure 12B:
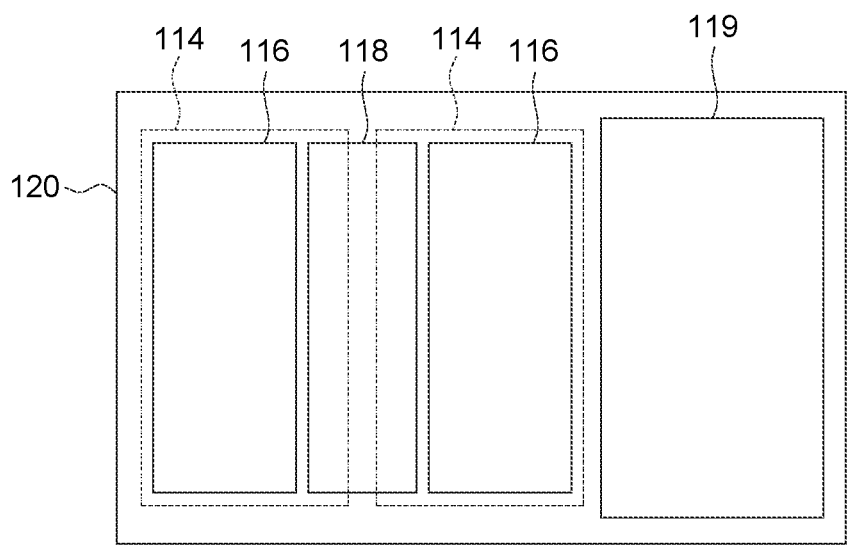
Figure 13A:
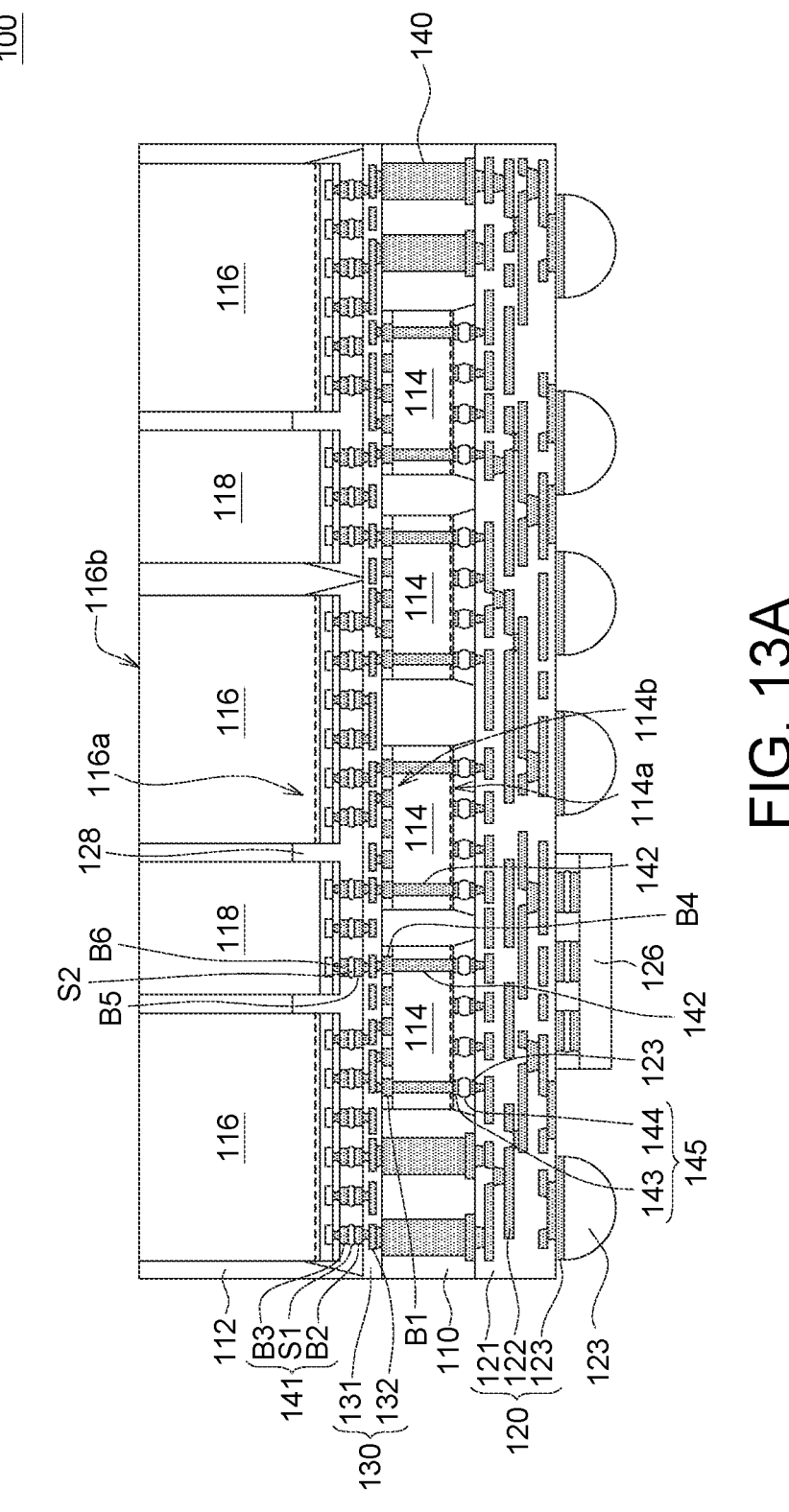
FIGS. 13A and 13B are a side cross-sectional view and a plan view of a semiconductor device package structure according to a thirteenth embodiment of the present disclosure.
Figure 13B:
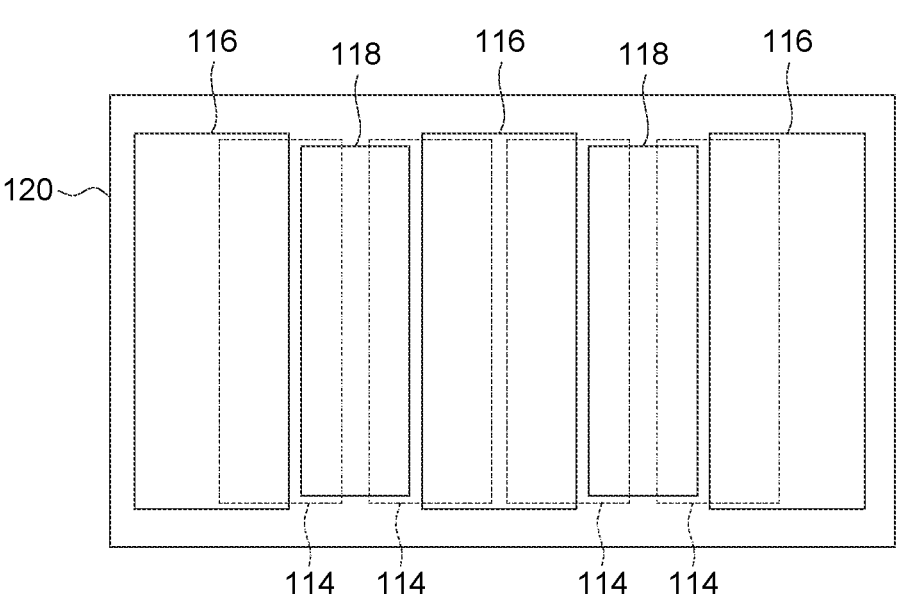
Figure 14A:
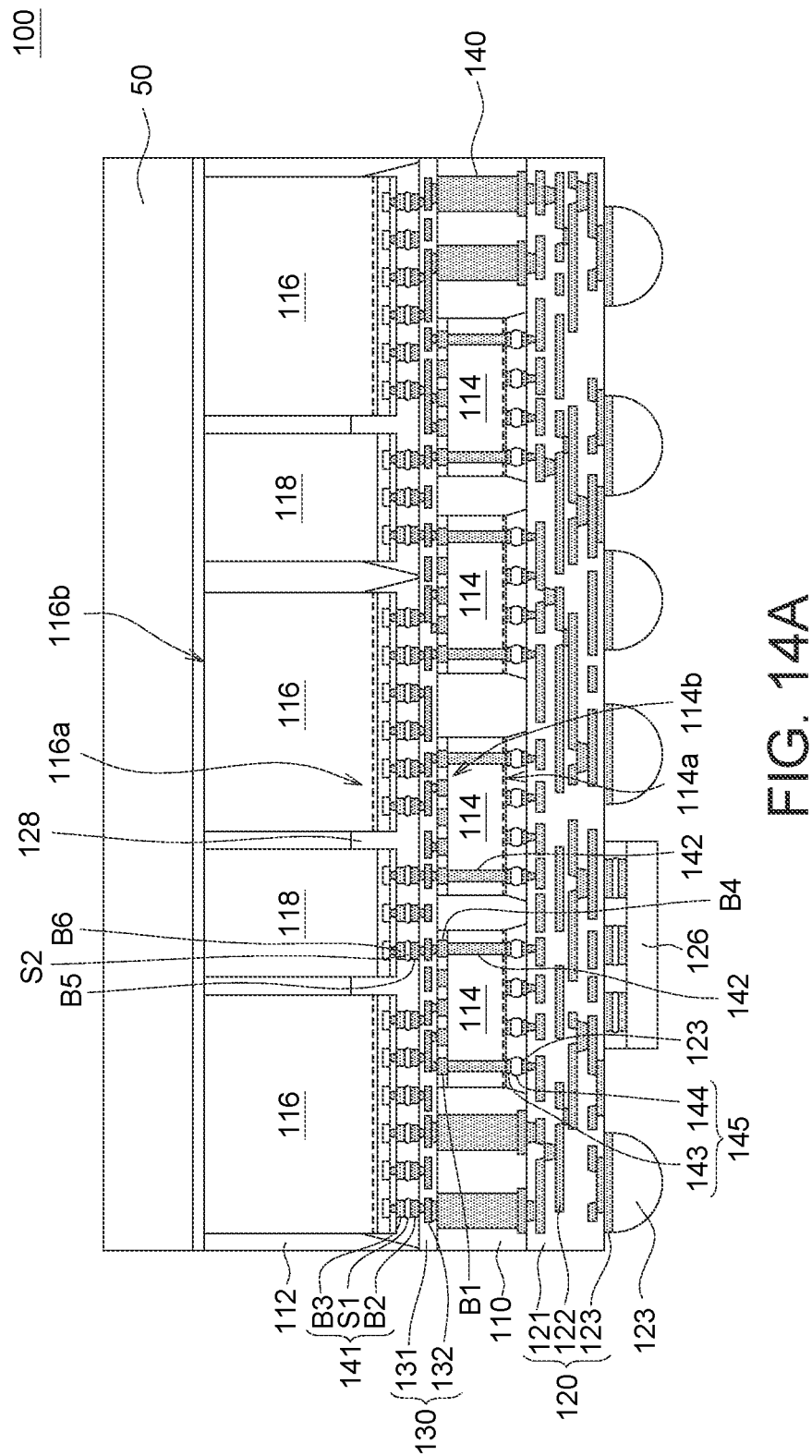
FIGS. 14A and 14B illustrate a side cross-sectional view and a plan view of a semiconductor device package structure according to a fourteenth embodiment of the present disclosure.
Figure 14B:
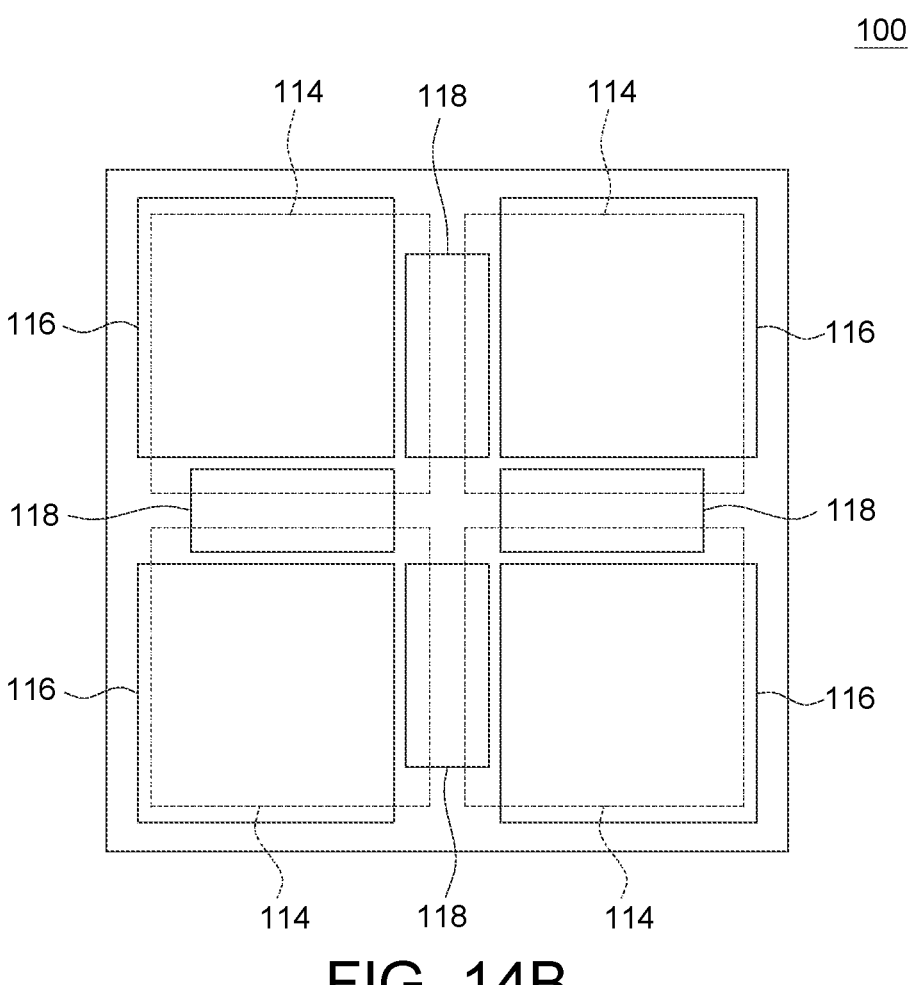

Referring to FIG. 8A and FIG. 14A, the heat dissipation substrate 150 is disposed on the second semiconductor device 116 and the bridge die 118, and the heat dissipation substrate 150 is, for example, a silicon substrate with a high thermal conductivity (140-200 W/mk) and a low thermal expansion coefficient. (6.5-9.5×10$^6$/K), which can be applied to the semiconductor device package structure 100 with/without through-silicon-via (TSV) to improve the heat dissipation performance and be compatible with the thermal expansion coefficients of the second semiconductor device 116 and the bridge die 118. The heat-dissipating substrate 150 is fixed on the package structure by, for example, a high-dielectric-constant adhesive 152, such as epoxy resin, and silicon dioxide (SiO$_2$) can be filled in the adhesive to reduce the thermal expansion coefficient. The semiconductor device package structure 100 shown in FIGS. 8A and 14A can be applied in fields with high heat dissipation requirements such as mobile communication, satellite communication, high-speed computing, and automobiles, but can also be applied in general consumer electronic products.

Figure 15A:
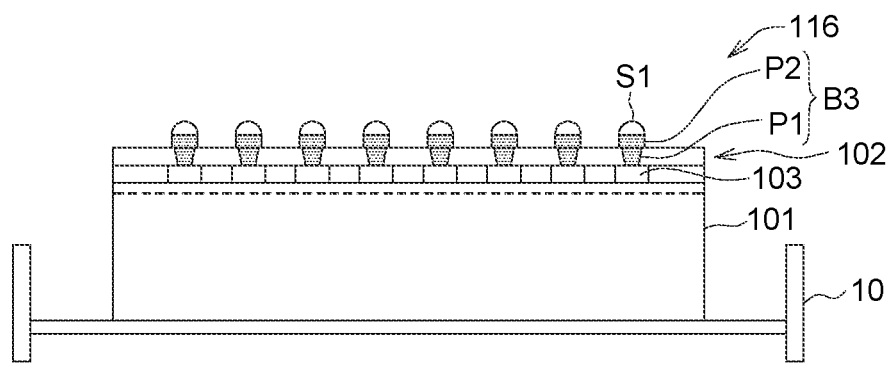
FIGS. 15A to 15G are schematic diagrams of a method for manufacturing a semiconductor device according to an embodiment of the present disclosure.

Referring to FIGS. 15A to 15G, schematic diagrams of a method for manufacturing a semiconductor device according to an embodiment of the present disclosure are shown. The manufacturing method of the semiconductor device is described as follows. In FIG. 15A, the conductive bumps B3 and soldering materials S1 are formed on the wafer-level substrate 101, and reflow and thinning of substrate are performed. The substrate 101 is placed on the wafer frame 10 for a singulation process to fabricate the second semiconductor device 116. The substrate 101 is made of silicon or other semiconductor materials. Alternatively or additionally, the substrate 101 includes other elementary semiconductor materials such as germanium, gallium arsenic, or other suitable semiconductor materials. The pads 103 are formed on the interconnect structure, and the pads 103 are electrically connected to the interconnect structure, so as to provide an external connection of the second semiconductor device 116. In some embodiments, the material of the pads 103 may include metal or metal alloys, such as aluminum, copper, nickel, or alloys thereof. The passivation layer 102 is formed over the substrate 101 and covers a portion of the pads 103. The passivation layer 102 includes an insulating material such as silicon oxide, silicon nitride, polymer, or a combination thereof. The passivation layer 102 may be a single-layer structure or a multi-layer structure. The conductive bumps B3 may be formed by plating process, such as electroplating, electroless plating or the like. The conductive bumps B3 are electrically connected to the pads 103. The conductive bump B3 includes a first portion P1 and a second portion P2 with a large size (CD is about 15 μm) on the first portion P1. The first portion P1 is located in the opening of the passivation layer 102, and the sidewalls of the second portion P2 extend laterally beyond the first portion P1.

Figure 15B:
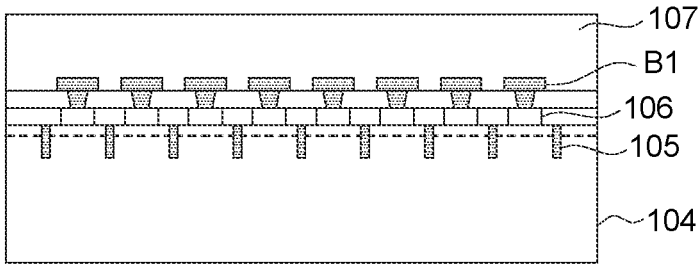
Figure 15C:
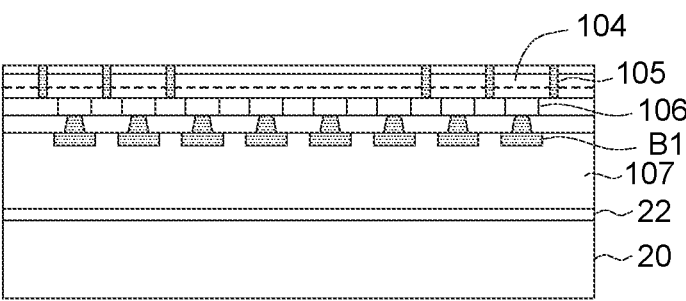

In FIG. 15B, TSVs 105, bonding pads 106, conductive bumps B1 and a protective layer 107 are formed on the active side of another wafer-level substrate 104. In FIG. 15C, after the wafer-level substrate 104 is inverted, the wafer-level substrate 104 is bonded to the first carrier substrate 20 by the adhesive 22. Next, a thinning process is performed on the backside of the substrate 104, and the thinning process includes CMP (chemical mechanical polishing), grinding, etching, combinations thereof, and the like. The thinning process removes a portion of the substrate 104 until the TSVs are exposed on the backside. In some embodiments, the protection layer 107 includes polyimide (PI) such as a low temperature PI (LTPI), PBO such as high temperature PBO (HTPBO), BCB, combinations thereof or the like. A curing process is performed to cure the protection layer 107, the temperature of the curing process of the protection layer 107 is between 170° C. to 320° C., such as 230° C.

Figure 15D:
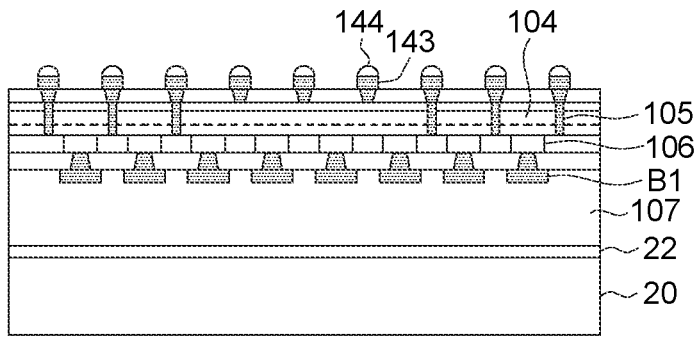
Figure 15E:
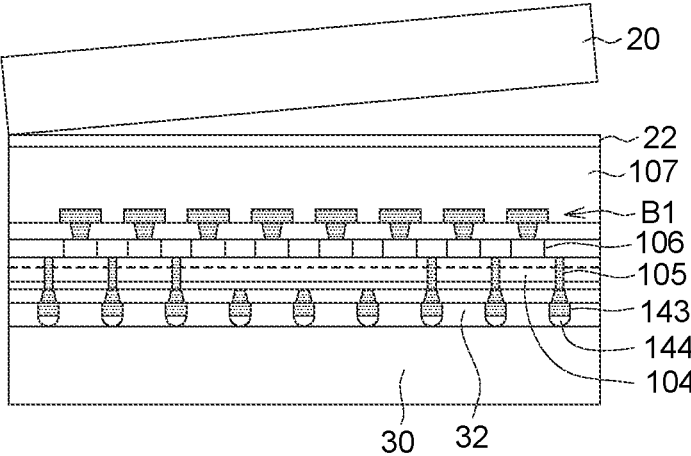

In FIG. 15D, a plurality of conductive bumps 143 and a plurality of soldering materials 144 are formed on the backside of the silicon substrate 104, and the manufacturing method thereof is the same as that described in FIG. 15A, and will not be repeated here. Next, in FIG. 15E, after the wafer-level substrate 104 is inverted, the substrate 104 is attached to the second carrier substrate 30 with the adhesive 32, and the first carrier substrate 20 is lifted off. The adhesives 22 and 23 may be formed of a de-bonding layer such as a Ultra-Violet (UV) glue, a light-to-heat conversion (LTHC) glue, or the like, or other types of adhesives. The de-bonding layer is decomposable under the heat of light to thereby release the carrier from the overlying structures that will be formed in subsequent steps.

Figure 15F:
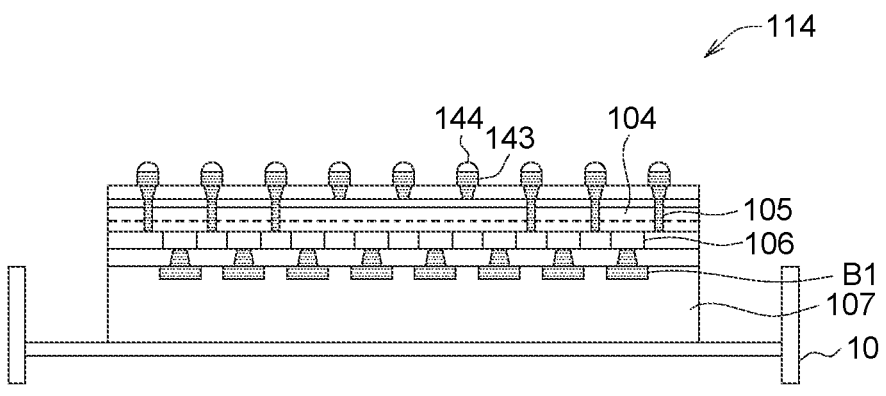

In FIG. 15F, the completed semiconductor structure is placed on the wafer frame 10, and the singulation process is performed to form a plurality of dies, and the adhesive 32 is removed to expose the conductive bumps 143 and the soldering material 144 on the backside of the substrate 104, so that the first semiconductor device 114 is fabricated.

Figure 15G:
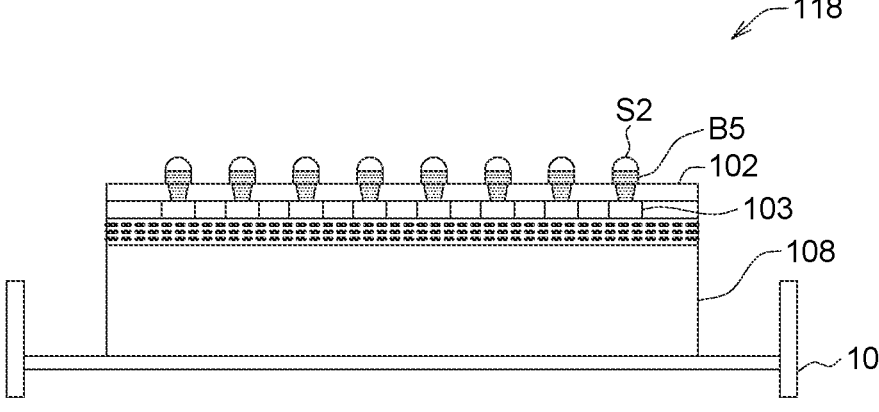

In FIG. 15G, conductive bumps B5 and soldering materials S2 are formed on another wafer-level substrate 108, reflow and thinning of the substrate 108 is performed, and the silicon substrate 108 is placed on the wafer frame 10 for a singulation process to fabricate a bridge die 118. The structures of the interconnect devices, the bonding pads 103, the conductive bumps B5 and the passivation layer 102 of the bridge die 118 are substantially the same as the corresponding devices and structures described in FIG. 15A, and will not be repeated here.

Figures 16A, 16B:
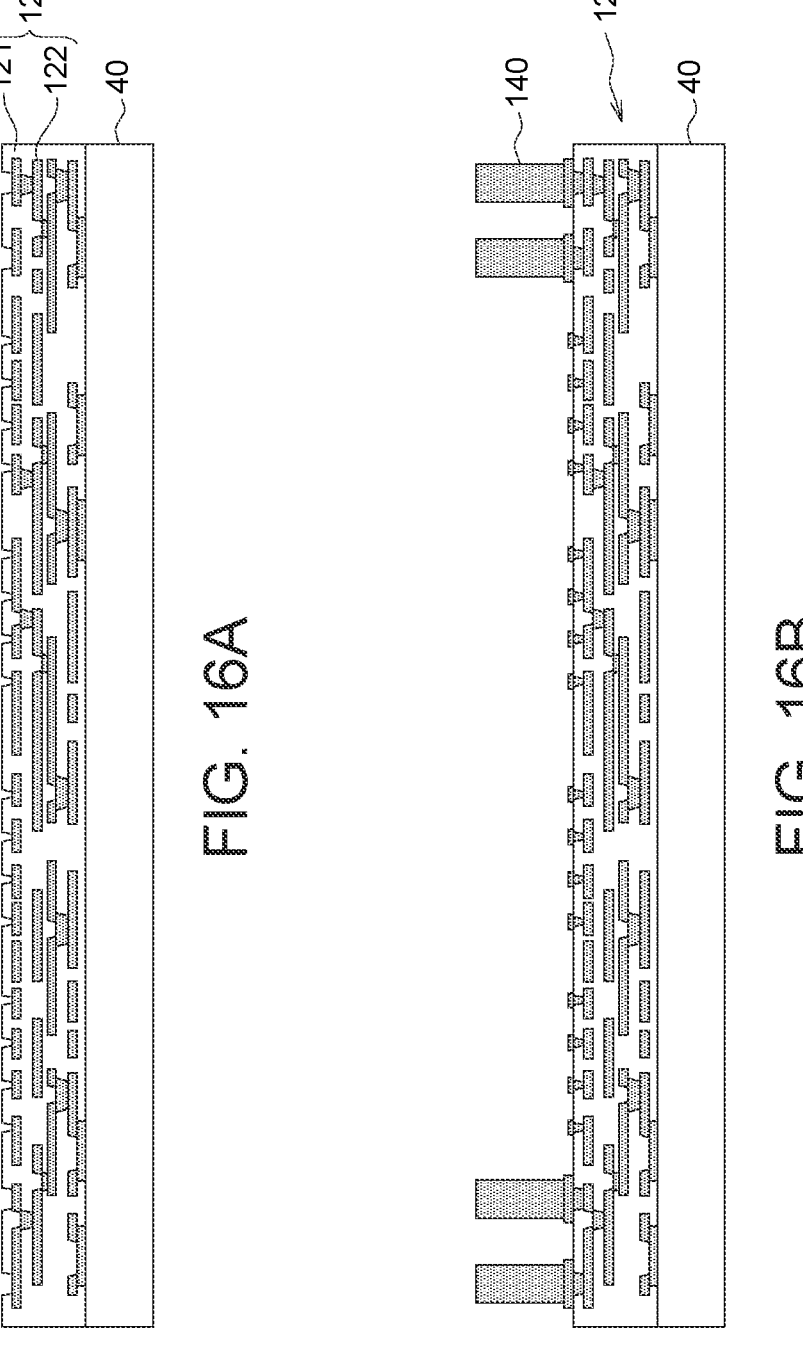
FIGS. 16A to 16H are schematic diagrams of a method for manufacturing a semiconductor device package structure according to an embodiment of the present disclosure.

A manufacturing method of the semiconductor device package structure 100 is described as follows: Referring to FIGS. 16A to 16H, a first redistribution structure 120 is formed on a first wafer-level carrier 40 in FIG. 16A. For the description of the first redistribution structure 120, please refer to FIG. 1A, in which the first redistribution structure 120 includes a plurality of dielectric layers 121 and a plurality of redistribution wire interconnects 122 stacked alternately. In FIG. 16B, an electroplating process is performed to form a plurality of conductive pillars (TMV) 140 on the first redistribution structure 120. The conductive pillars 140 are coupled to the first redistribution structure 120 via corresponding landing pads formed on the top surface of the first redistribution structure 120. The wiring structure 120, for example, a seed layer (not shown) is first formed on the first redistribution structure 120 and a photoresist (not shown) is formed on the seed layer, the photoresist is patterned to form a plurality of photoresist openings, and then an electroplating process is performed to form a plurality of conductive pillars 140 on the seed layer. Photoresist is removed and then excess seed layer is etched. Therefore, the present disclosure does not need to use laser etching to form a plurality of TMV openings in the filling layer, but firstly forms the conductive pillars 140 and then performs the EMC filling process. For a high-density package employing, for example, multiple stacked dies, a height of the packages can be large, thereby resulting in a relatively large height of the molding compound in the package. When drilling a hole in the molding compound with relatively large height, the diameter of the TMV openings can get relatively large (e.g., compared to the conductive pillars 140 with a small diameter about 40 μm, and pitch is 80 μm). Having a large diameter TMV results in misuse of the package area, and it may be difficult in detecting any potential defect in a large diameter TMV.

Figures 16C, 16D:
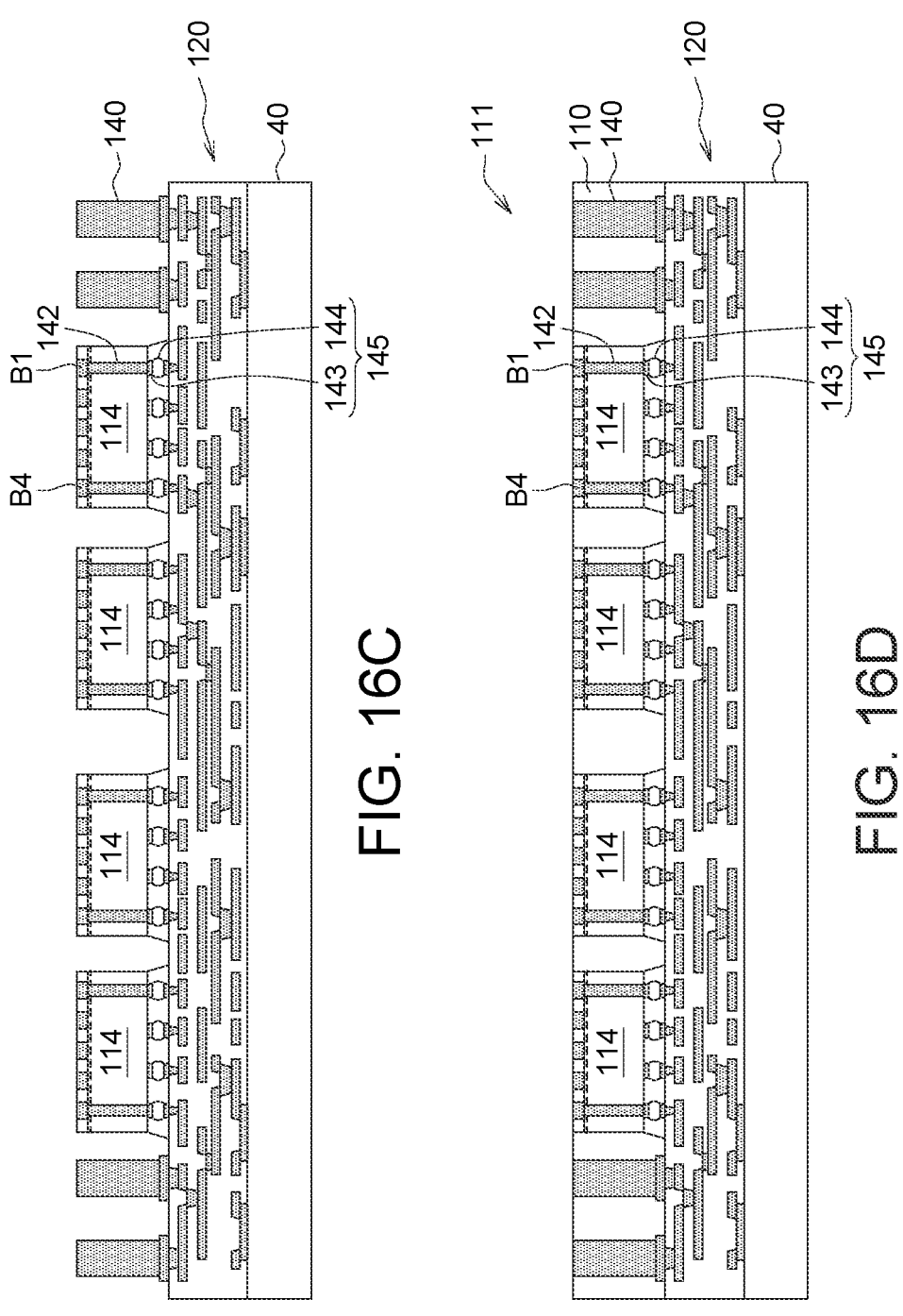

In FIG. 16C, the fabricated first semiconductor devices 114 are disposed on the first redistribution structure 120. The first semiconductor devices 114 can be electrically connected to each other through the first redistribution structure 120 to complete the fan-out process of the first semiconductor devices 114. The first semiconductor device 114 may include a plurality of TSV structures 142 and a plurality of die bonding structures 145 connected between the TSV structures 142 and the first redistribution structure 120. In addition, the first semiconductor device 114 may include a plurality of first conductive bumps B1 and fourth conductive bumps B4 on the active side of the first semiconductor device 114.

In FIG. 16D, an EMC molding material is filled to cover the first semiconductor devices 114 and the conductive pillars 140, and a planarization process is performed to make the top surface of the EMC and the upper surfaces of the first semiconductors devices 114 are coplanar. After the planarization of the first filling layer 110 is completed, a first package body 111 is formed, and the first conductive bumps B1 can be used as the die bonding structure of the first package body 111 in the subsequent process to complete the 3D wafer level packaging process.

Figure 16E:
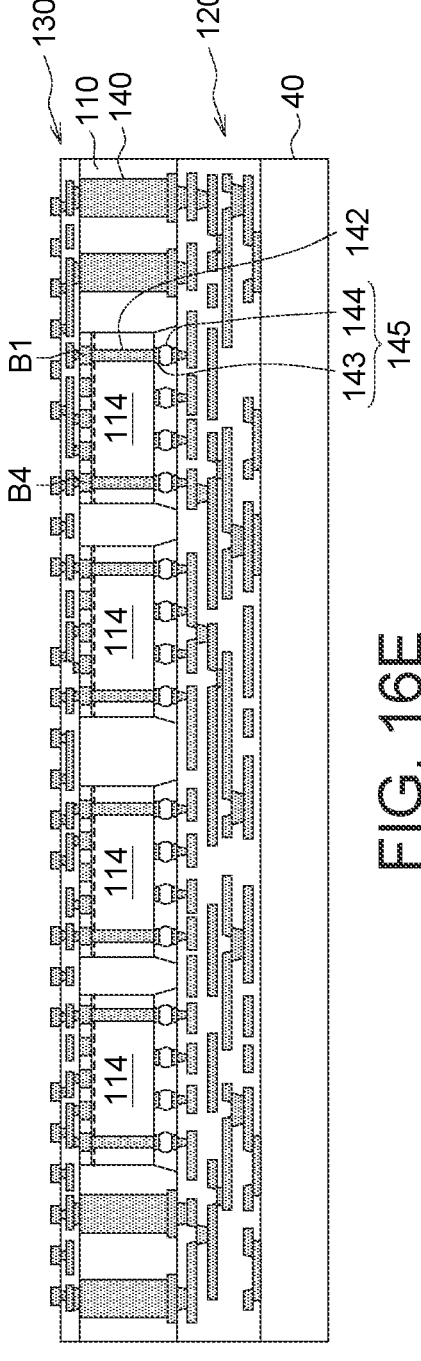

In FIG. 16E, a second redistribution structure 130 is formed on the upper surface of a first package body 111. For the description of the second redistribution structure 130, please refer to FIG. 1A. The second redistribution structure 130 is fabricated as same as that of the first redistribution structure 120. The second redistribution structure 130 includes a plurality of second conductive bumps B2, and the redistribution wiring interconnects 132 of the second redistribution structure 130 is electrically connected between the first conductive bumps B1 and the second conductive bumps B2.

Figure 16F:
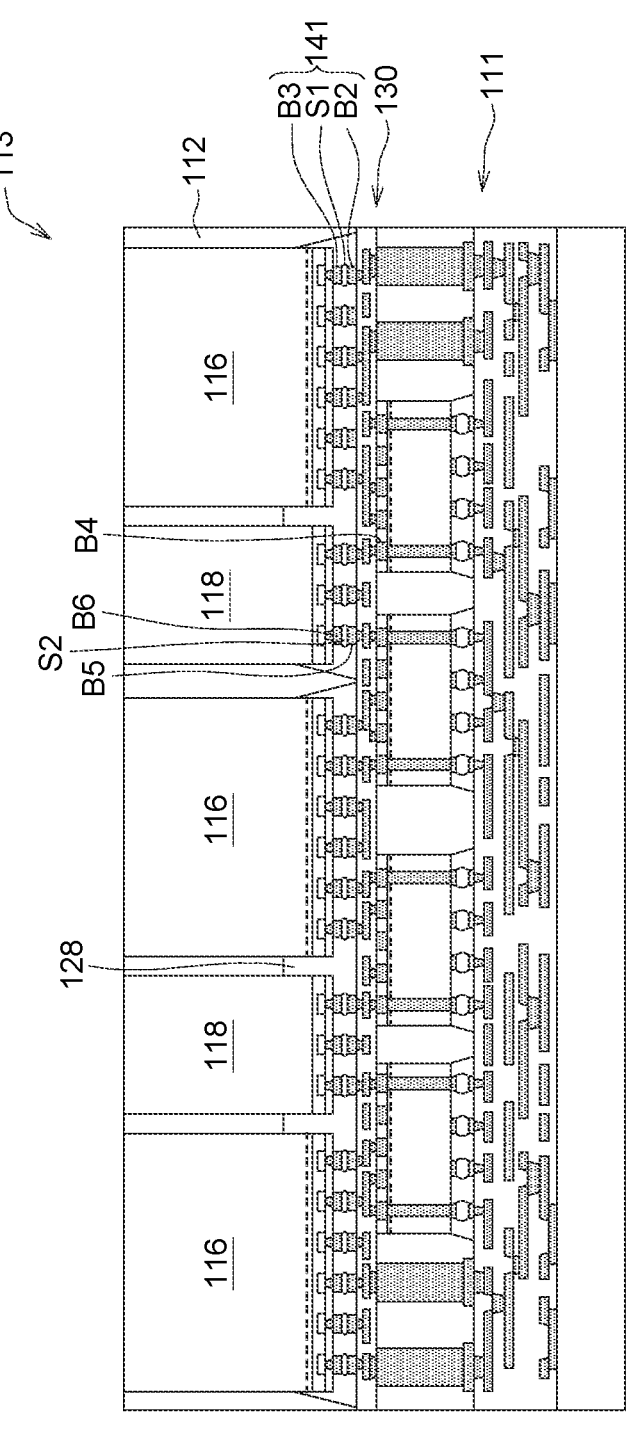

In FIG. 16F, a plurality of second semiconductor devices 116 and a plurality of bridge dies 118 are formed on the second redistribution structure 130. The first semiconductor devices 114, the bridge dies 118 and the second semiconductor devices 116 can be electrically connected through the second redistribution structure 130 to form a 3D system-on-integrated chips (SoIC) package structure. The bridge die 118 can be disposed between two adjacent first semiconductor devices 114, and the first semiconductor devices 114 and the second semiconductor devices 116 are disposed in a face-to-face manner, for example, and copper bumps can be used as a die bonding structure between the first semiconductor devices 114 and the second semiconductor devices 116 and/or between the bridge dies 118 and the first semiconductor devices 114 to form a high density of input/output contacts.

In FIG. 16F, an EMC molding material is filled to cover the second semiconductor devices 116 and the bridge dies 118, and a planarization process is performed to make the top surface of the EMC, the top surface of the second semiconductor devices 116 and the top surface of the bridge dies 118 are coplanar. After the planarization of the second filling layer 112 is completed, a second package body 113 is formed, and the second package body 113 and the first package body 111 are stacked on each other to complete the 3D wafer-level packaging process.

Figure 16G:
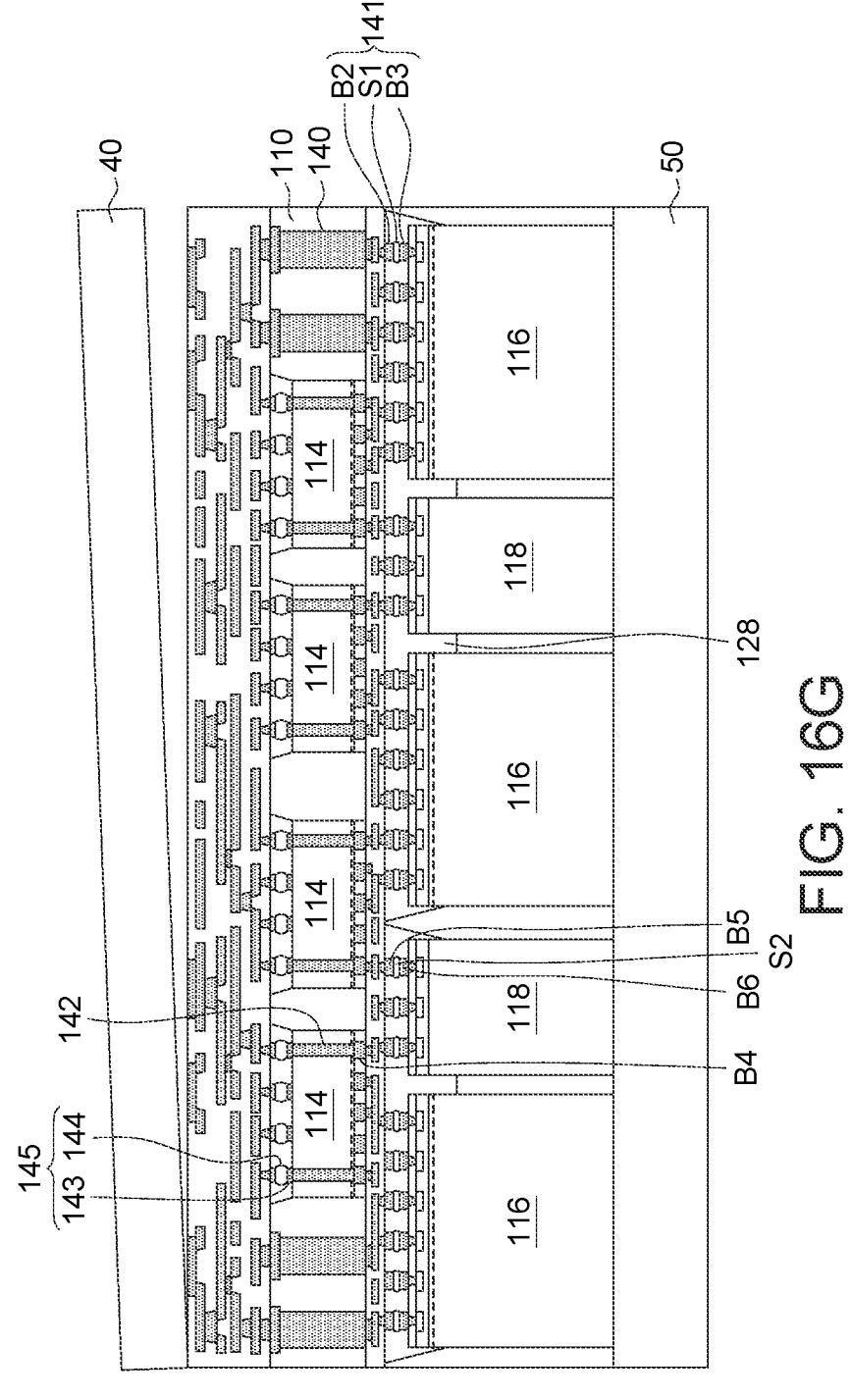
Figure 16H:
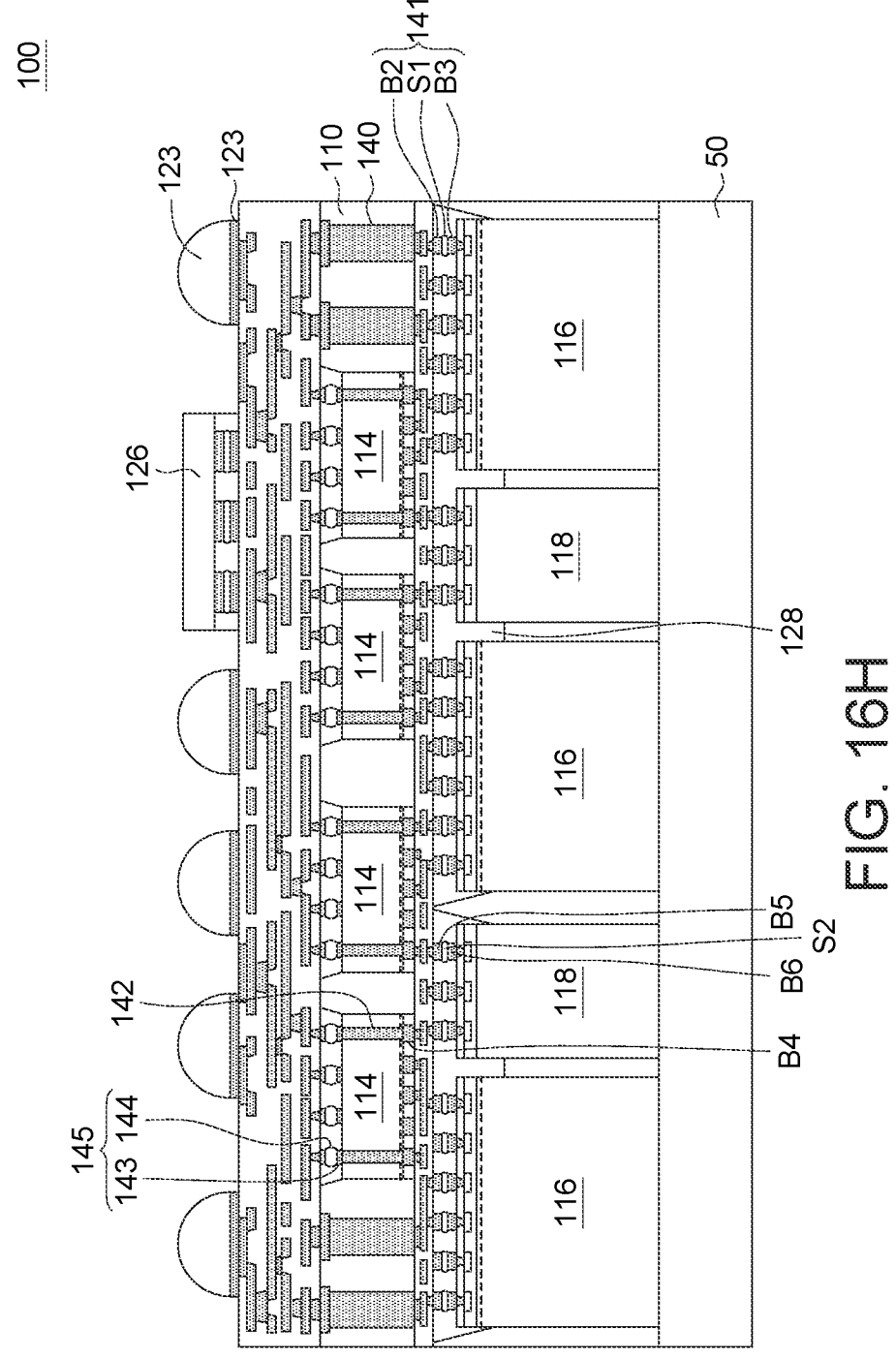

In FIG. 16G, the completed wafer-level package structure is reversely disposed on the second wafer-level carrier 50, and the first wafer-level carrier 40 is removed to expose the bottom side of the first redistribution structure 120. In FIG.

16H, the soldering materials 124 (e.g., solder balls) can be formed on the first bonding pads 123, and an IPD 126 can be formed on the bottom side of the first redistribution structure 120. After that, the 3D wafer-level package structure is diced to form a plurality of separated semiconductor device package structures 100.

Figure 17A:
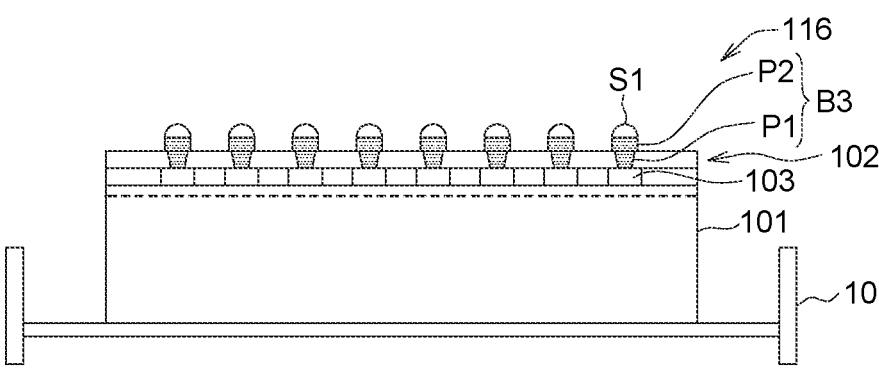
FIGS. 17A to 17G are schematic diagrams of a method for fabricating a semiconductor device according to another embodiment of the present disclosure.

Referring to FIGS. 17A to 17G, schematic diagrams of a method for fabricating a semiconductor device according to another embodiment of the present disclosure are shown. A manufacturing method of a semiconductor device according to another embodiment is described as follows: In FIG. 17A, conductive bumps B3 and soldering materials S1 are formed on the wafer-level substrate 101, reflow and thinning of the substrate 101 is performed, and silicon substrate 101 is placed on the wafer frame 10 to perform a singulation process to fabricate a second semiconductor device 116, as same as the process shown in FIG. 15A.

Figure 17B:
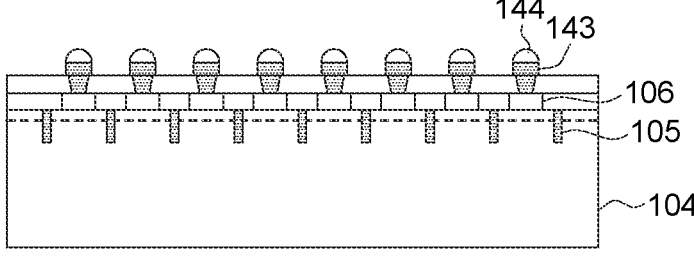
Figure 17C:
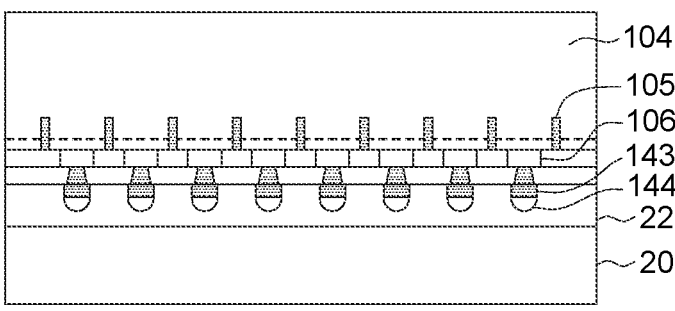
Figure 17D:
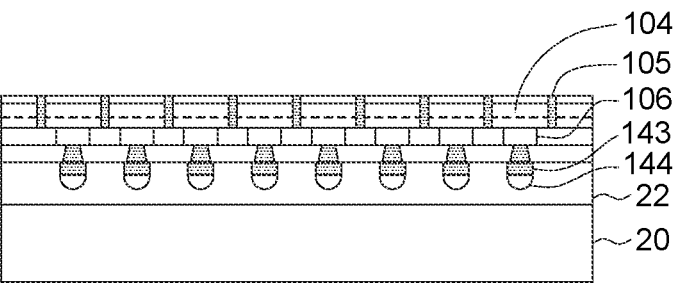

In FIG. 17B, TSVs 105, bonding pads 106, conductive bumps 143 and soldering materials 144 are formed on the active side of another wafer level substrate 104. In FIG. 17C, after the wafer-level substrate 104 is inverted, the wafer-level substrate 104 is bonded to the first carrier substrate 20 with the adhesive 22. In FIG. 17D, a thinning process is performed on the backside of the substrate 104, and the thinning process includes CMP, grinding, etching, combinations thereof, and the like. The thinning process removes a portion of the substrate 104 until the TSVs 105 are exposed on the backside of the substrate 104.

Figure 17E:
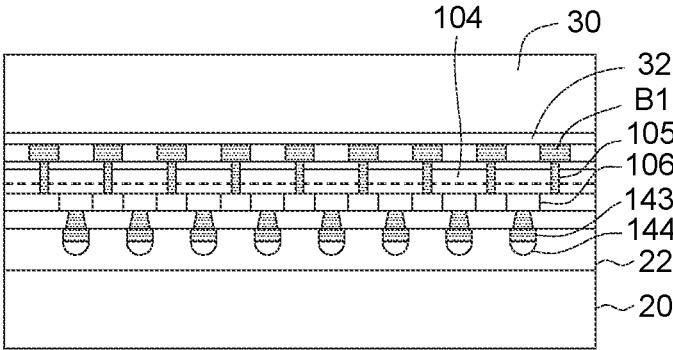
Figure 17F:
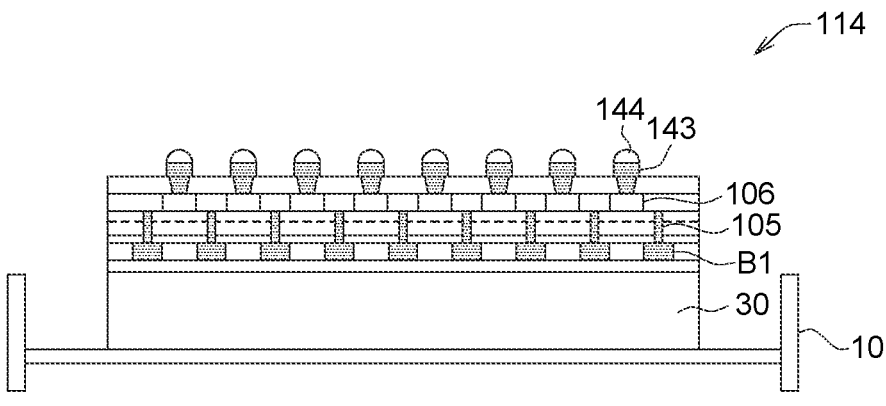

In FIG. 17E, a plurality of conductive bumps B1 are formed on the backside of the silicon substrate 104, and a second carrier substrate 30 is formed thereon, and the second carrier substrate 30 is attached on the backside by the adhesive 32. After that, the first carrier substrate 20 is lifted off. In FIG. 17F, the second carrier substrate 30 is placed on the wafer frame 10, the singulation process is performed, and the adhesive 22 is removed to expose the conductive bumps 143 and the soldering materials 144 on the active side of the silicon substrate for fabricating the first semiconductor device 114.

Figure 17G:
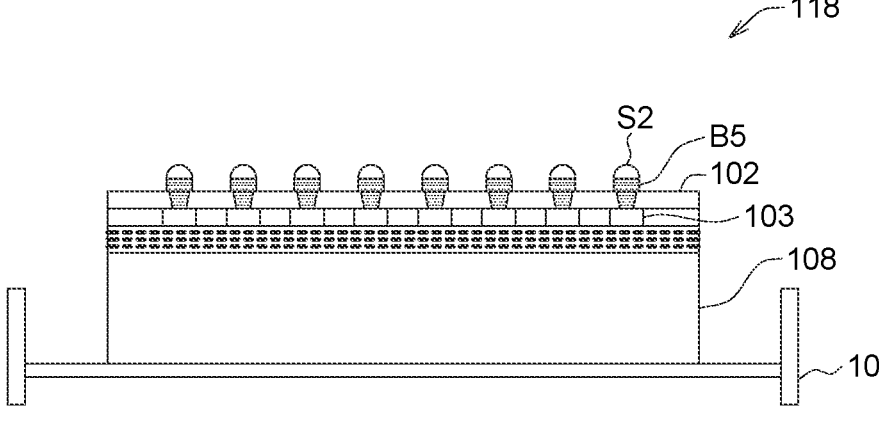

In FIG. 17G, conductive bumps B5 and soldering materials S2 are formed on another wafer-level substrate 108, reflow and thinning processes of the substrate 108 is performed, and the silicon substrate 108 is placed on the wafer frame 10 to perform a singulation process to form a bridge die 118, as same as the process shown in FIG. 15G.

Figures 18A, 18B:
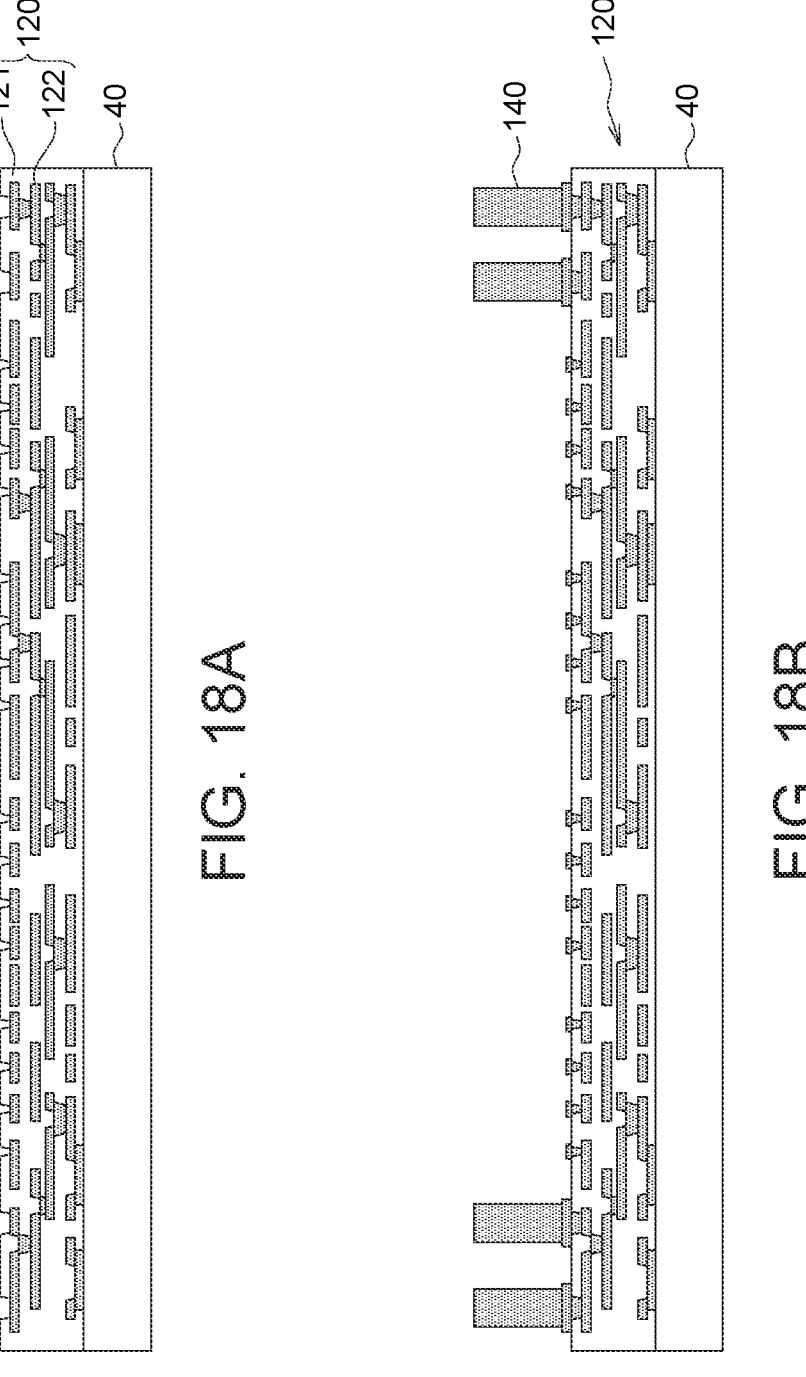
FIGS. 18A to 18H are schematic diagrams of a method for manufacturing a semiconductor device package structure according to another embodiment of the present disclosure.

Referring to FIGS. 18A to 18H, schematic diagrams of a method for manufacturing a semiconductor device package structure according to another embodiment of the present disclosure are shown. The manufacturing method of the semiconductor device package structure 100 is described as follows. A first redistribution structure 120 is formed on a first wafer-level carrier 40 in FIG. 18A, the description of the first redistribution structure 120 is shown in FIG. 16A, and details are not repeated here. In FIG. 18B, an electroplating process is performed to form a plurality of conductive pillars (TMVs) 140 on the first redistribution structure 120. The conductive pillars 140 are coupled to the first redistribution structure 120 via corresponding landing pads formed on the top surface of the first redistribution structure 120. For example, a seed layer (not shown) is formed on the first redistribution structure 120 and a photoresist (not shown) is formed on the seed layer, and the photoresist is patterned to form a plurality of openings, and then an electroplating process is performed to form a plurality of conductive pillars 140 on the seed layer. Photoresist is removed and then excess seed layer is etched. Therefore, the present disclosure does not need to use laser etching to form a plurality of TMV openings, but firstly forms the conductive pillars 140 and then performs the EMC filling process, as same as the process shown in FIG. 16B.

Figure 18C:
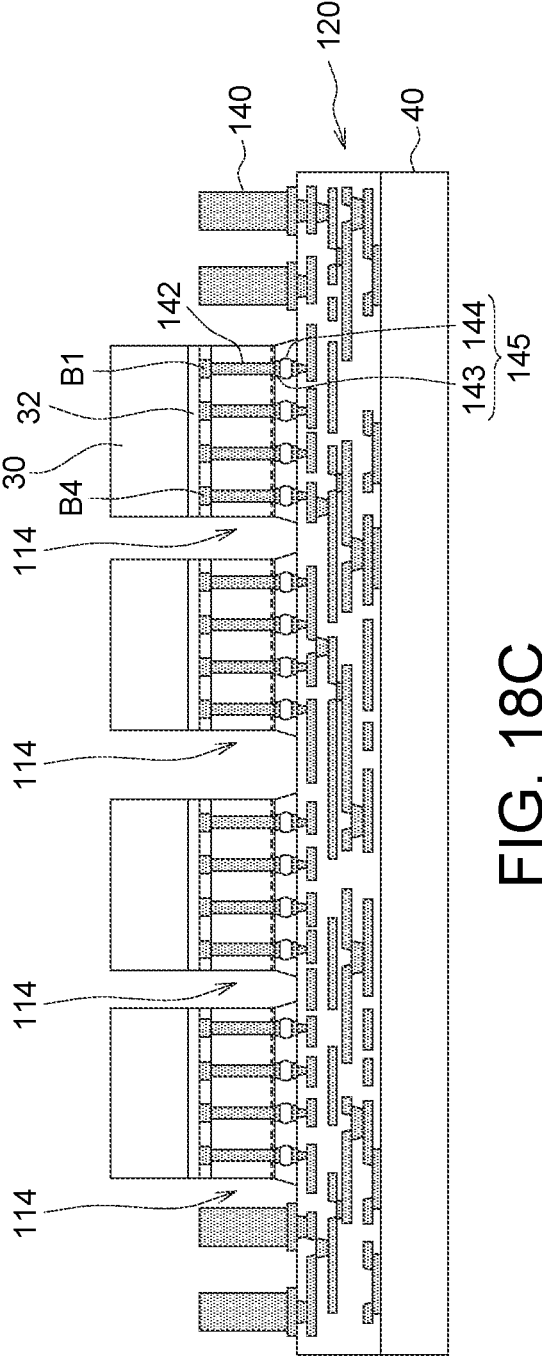

In FIG. 18C, the fabricated first semiconductor devices 114 are disposed on the first redistribution structure 120. The first semiconductor devices 114 can be electrically connected to each other through the first redistribution structure 120 to complete the fan-out process of the first semiconductor devices 114. The first semiconductor device 114 may include a plurality of TSV structures 142 and a plurality of die bonding structures 145 connected between the TSV structures 142 and the first redistribution structure 120. In addition, the first semiconductor device 114 may include a plurality of first conductive bumps B1 and a plurality of fourth conductive bumps B4 located on the backside of the first semiconductor device 114. In subsequent process, the second carrier substrate 30 and the adhesive 32 may be removed to expose the first conductive bumps B1 and the fourth conductive bumps B4.

Figures 18D, 18E:
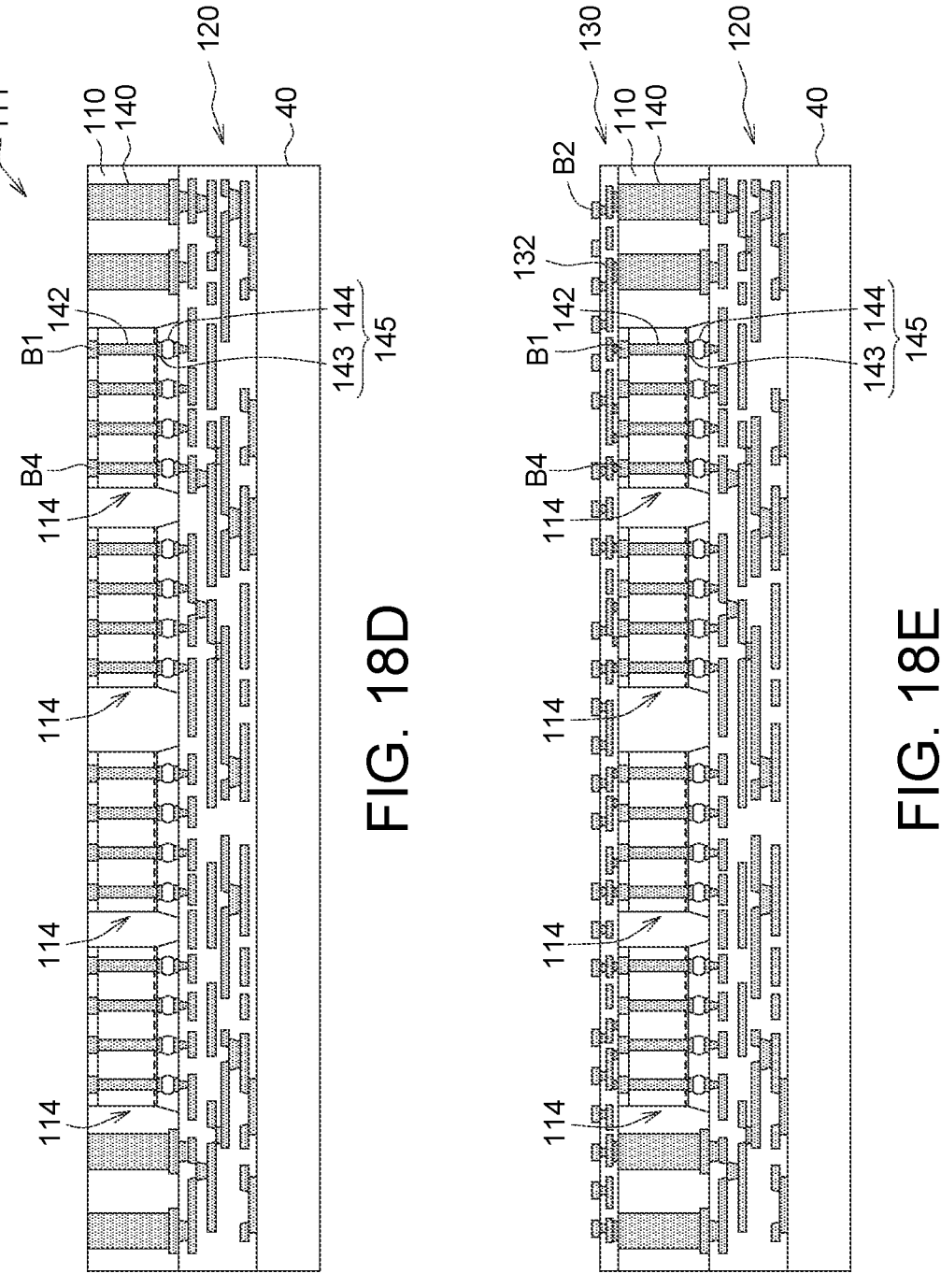

In FIG. 18D, an EMC molding material is filled to cover the first semiconductor devices 114 and the conductive pillars 140, and a planarization process is performed to make the top surface of the EMC and the top surfaces of the first semiconductors devices 114 are coplanar. After the planarization of the first filling layer 110 is completed, a first package body 111 is formed. In the subsequent process, the first conductive bumps B1 and the fourth conductive bumps B4 can be used as the die bonding structure of the first package body 111 to complete the 3D wafer-level packaging process.

In FIG. 18E, a second redistribution structure 130 is formed on the upper surface of the first package body 111. For the description of the second redistribution structure 130, please refer to FIG. 1A. The second redistribution structure 130 is fabricated as same as that of the first redistribution structure 120. The second redistribution structure 130 includes a plurality of second conductive bumps B2, and the redistribution wiring interconnects 132 of the second redistribution structure 130 is electrically connected between the first conductive bump B1 and the conductive bumps B2 and between the fourth conductive bump B4 and the second conductive bump B2.

Figure 18F:
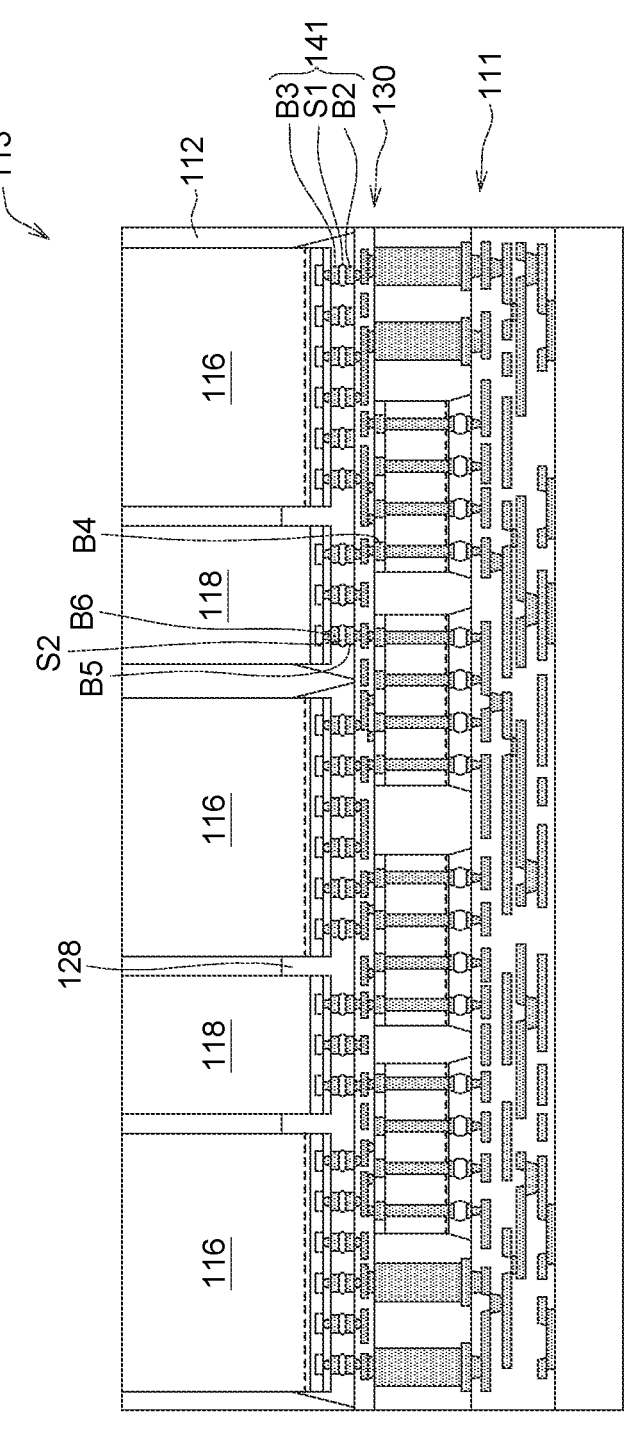

In FIG. 18F, a plurality of second semiconductor devices 116 and a plurality of bridge dies 118 are formed on the second redistribution structure 130. The first semiconductor devices 114, the bridge dies 118 and the second semiconductor devices 116 can be electrically connected to each other through the second redistribution structure 130 to form a 3D system-on-integrated-chips (SoIC) package structure. The bridge die 118 may be disposed between two adjacent first semiconductor devices 114, and the first semiconductor devices 114 and the second semiconductor devices 116 are disposed in a face-to-back manner, for example, and copper bumps can be used as die bonding structures between the first semiconductor devices 114 and the second semiconductor devices 116 and between the bridge dies 118 and the first semiconductor device 114s to form a high density of contacts.

In FIG. 18F, an EMC molding material is filled to cover the second semiconductor devices 116 and the bridge dies 118, and a planarization process is performed to make the top surface of the EMC, the top surface of the second semiconductor devices 116 and the top surface of the bridge dies 118 are coplanar. After the planarization of the second filling layer 112 is completed, a second package body 113 is formed, and the second package body 113 and the first package body 111 are stacked on each other to complete the 3D wafer-level packaging process.

Figure 18G:
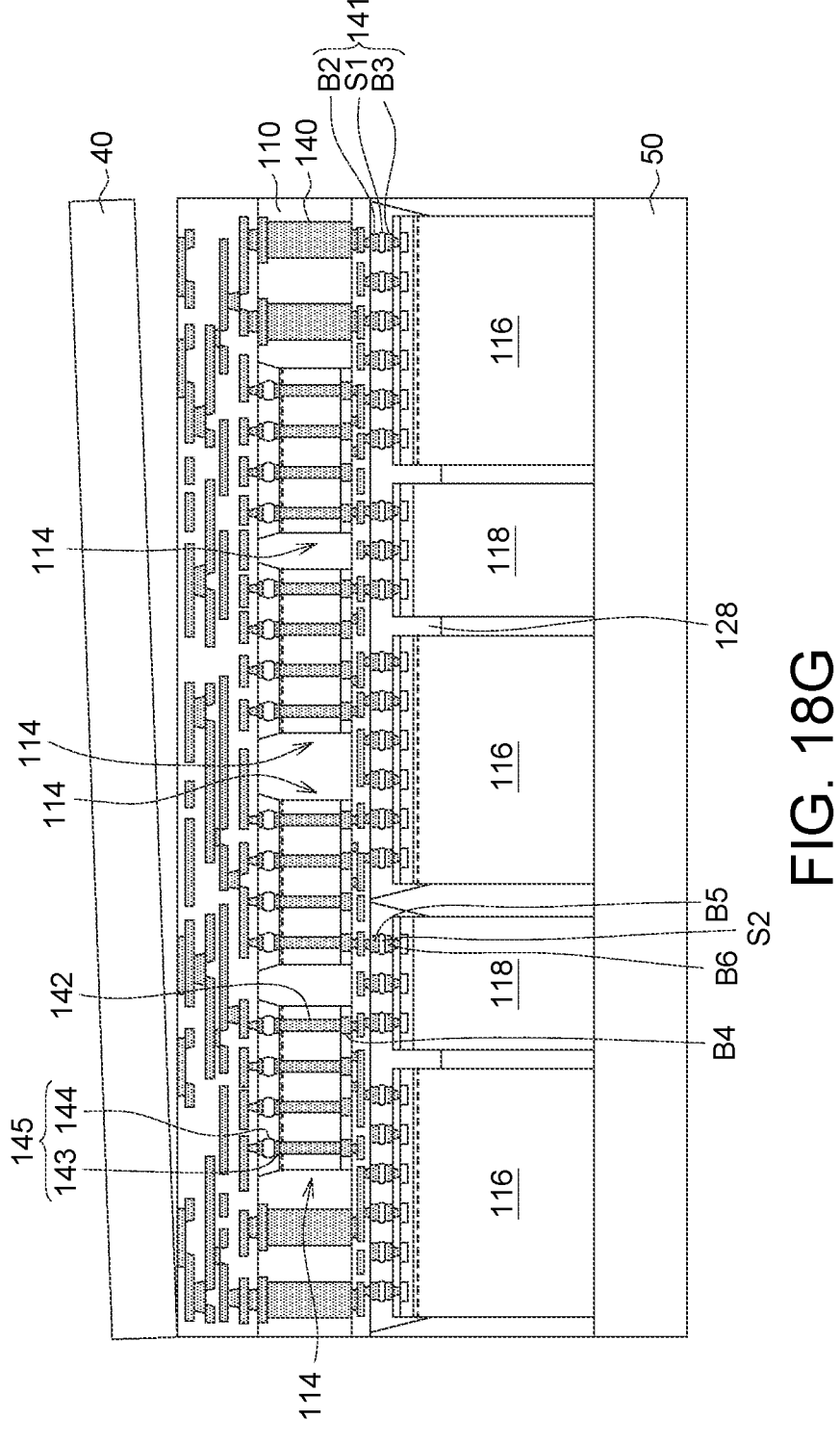
Figure 18H:
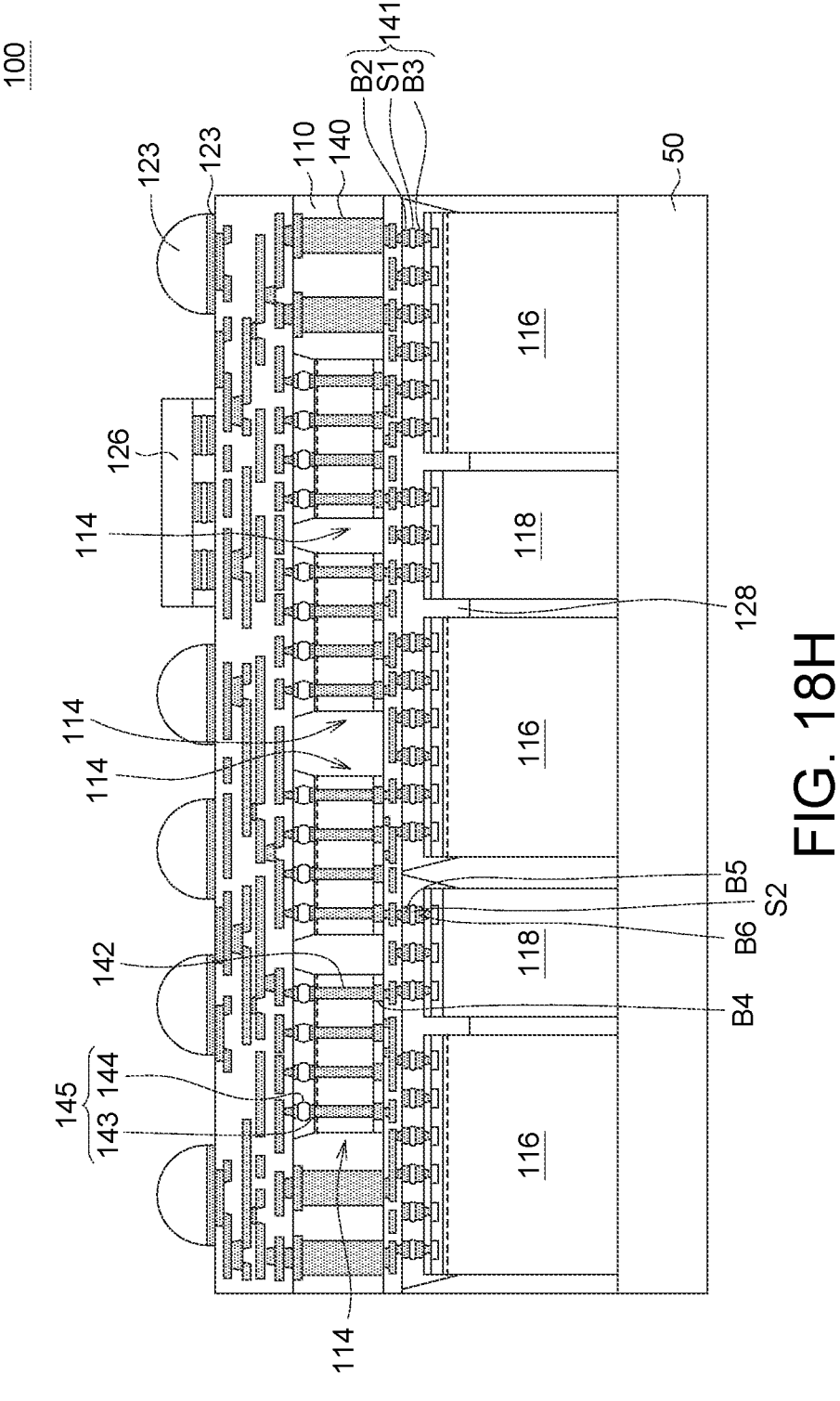

In FIG. 18G, the completed wafer-level package structure is reversely disposed on the second wafer-level carrier 50, and the first wafer-level carrier 40 is removed to expose the bottom side of the first redistribution structure 120. In FIG. 18H, the soldering materials 124 (e.g., solder balls) can be formed on the first bonding pads 123, and an IPD 126 can be formed on the bottom side of the first redistribution structure 120. After that, the 3D wafer-level package structure is diced to form a plurality of separated semiconductor device package structures 100.

The present disclosure relates to a semiconductor device package structure and a manufacturing method thereof, which adopts micro-bump joint bond technology for 3D wafer-lever package, conforms to current InFO based technology, and the high density of contacts through fine pitch InFO RDLs, stacked vias and TSVs to connect with multiple chips can be achieved, so that the effect of flexible chip size, small chip thickness, more chip function integration and low cost can be done.

According to some embodiments of the present disclosure, a semiconductor device packaging structure is provided, including a first redistribution structure, a second redistribution structure, a first semiconductor device, a second semiconductor device, a first conductive bump, a second conductive bump, a third conductive bump, and a first solder material. The first redistribution structure is disposed on a first side of the second redistribution structure. The first semiconductor device is disposed on the first side of the second redistribution structure, and the second semiconductor device is disposed on a second side of the second redistribution structure, and the first side is opposite to the second side. The first conductive bump is disposed on the first semiconductor device, the second conductive bump is disposed on the second side of the second redistribution structure, and the third conductive bump is disposed on the second semiconductor device and opposite to the second conductive bumps. The first solder material is electrically connected between the second conductive bump and the third conductive bump, and the second redistribution structure is electrically connected between the first conductive bump and the second conductive bump.

According to some embodiments of the present disclosure, a semiconductor device package structure is provided, including a redistribution structure, a first semiconductor device, a second semiconductor device, a bridge die, a first conductive bump, and a second conductive bump, a third conductive bumps, and a first solder material. The first semiconductor device is disposed on a first side of the redistribution structure, the second semiconductor device and the bridge die are disposed on a second side of the redistribution structure, and the first side is opposite to the second side. The first conductive bump is disposed on the first semiconductor device, the second conductive bump is disposed on the second side of the redistribution structure, and the third conductive bump is disposed on the second semiconductor device and opposite to the second conductive bump. The first solder material is electrically connected between the second conductive bump and the third conductive bump, and the redistribution structure is electrically connected between the first conductive bump and the second conductive bump.

According to some embodiments of the present disclosure, a manufacturing method of a semiconductor device package structure is provided, which includes the following steps. A first redistribution structure is formed on a first carrier. A first semiconductor device is disposed on the first redistribution structure, and the first semiconductor device includes a first conductive bump. A first filling layer is formed to cover the first semiconductor device, and the first filling layer is cured. A second redistribution structure is formed on the first filling layer, and the second redistribution structure includes a second conductive bump. A second semiconductor device is arranged on the second redistribution structure, the second semiconductor device includes a third conductive bump and a first solder material, the third conductive bump is disposed opposite to the second conductive bump, the first solder material is electrically connected between the second conductive bump and the third conductive bump, and the second redistribution structure is electrically connected between the first conductive bump and the second conductive bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device package structure, comprising:
a first redistribution structure;
a second redistribution structure, wherein the first redistribution structure is disposed on a first side of the second redistribution structure;
a first semiconductor device disposed on the first side of the second redistribution structure;
a second semiconductor device disposed on a second side of the second redistribution structure, the first side being opposite to the second side;
a first conductive bump disposed on the first semiconductor device;
a second conductive bump disposed on the second side of the second redistribution structure;
a third conductive bump disposed on the second semiconductor device and opposite to the second conductive bump;
a first solder material electrically connected between the second conductive bump and the third conductive bump, and the second redistribution structure being electrically connected between the first conductive bump and the second conductive bump; and
a bridge die, wherein the second semiconductor device and the bridge die are disposed on the second side of the second redistribution structure, and a vertical projection area of the bridge die and a vertical projection area of the first semiconductor device are partially overlapped.

2. The package structure according to claim 1, wherein the first semiconductor device further comprises a through-silicon-via structure and a die bonding structure connected between the through-silicon-via structure and the first redistribution structure.

3. The package structure according to claim 1, further comprising:
a fourth conductive bump disposed on the first semiconductor device;

a fifth conductive bump disposed on the second side of the first redistribution structure;
a sixth conductive bump disposed on the bridge die and opposite to the fifth conductive bump; and
a second solder material electrically connected between the fifth conductive bump and the sixth conductive bump, and the second redistribution structure being electrically connected between the fourth conductive bump and the fifth conductive bump.

4. The package structure according to claim 1, further comprising a first filling layer surrounding the first semiconductor device, and the first filling layer comprises epoxy molding compound.

5. The package structure according to claim 4, further comprising a second filling layer surrounding the second semiconductor device, and the second filling layer comprises epoxy molding compound.

6. The package structure according to claim 4, further comprising a conductive pillar penetrating the first filling layer, the conductive pillar being electrically connected between the first redistribution structure and the second redistribution structure.

7. The package structure according to claim 1, wherein the first semiconductor device has a first active side and a first backside, the second semiconductor device has a second active side and a second backside, the first conductive bump is disposed on the first active side, the third conductive bump is disposed on the second active side, and the first active side and the second active side are arranged in a face-to-face manner.

8. The package structure according to claim 1, wherein the first semiconductor device has a first active side and a first backside, the second semiconductor device has a second active side and a second backside, the first conductive bump is disposed on the first backside, the third conductive bump is disposed on the second active side, and the first backside and the second active side are arranged in a face-to-face manner.

9. The package structure according to claim 1, wherein a plurality of the first semiconductor devices are disposed on the first side of the second redistribution structure, and the bridge die provides an interconnect structure between two adjacent first semiconductor devices of the plurality of the first semiconductor devices.

10. A semiconductor device package structure, comprising:
a redistribution structure;
a first semiconductor device disposed on a first side of the redistribution structure;
a second semiconductor device;
a bridge die, wherein the second semiconductor device and the bridge die are disposed on a second side of the redistribution structure, and the first side is opposite to the second side;
a first conductive bump disposed on the first semiconductor device;
a second conductive bump disposed on the second side of the redistribution structure;
a third conductive bump disposed on the second semiconductor device and opposite to the second conductive bump; and
a first solder material electrically connected between the second conductive bump and the third conductive bump, and the redistribution structure being electrically connected between the first conductive bump and the second conductive bump.

11. The package structure according to claim 10, further comprising:

a fourth conductive bump disposed on the first semiconductor device;

a fifth conductive bump disposed on the second side of the redistribution structure;

a sixth conductive bump disposed on the bridge die and opposite to the fifth conductive bump; and a second solder material electrically connected between the fifth conductive bump and the sixth conductive bump, and the redistribution structure being electrically connected between the fourth conductive bump and the fifth conductive bump.

12. The package structure according to claim 10, further comprising a heat dissipation substrate disposed on top of the second semiconductor device and the bridge die.

13. The package structure according to claim 10, wherein a vertical projection area of the bridge die and a vertical projection area of the first semiconductor device are partially overlapped.

14. A method for manufacturing a semiconductor device package structure, comprising:

forming a first redistribution structure on a first carrier;

disposing a first semiconductor device on the first redistribution structure, the first semiconductor device comprising a first conductive bump;

forming a first filling layer to cover the first semiconductor device, and curing the first filling layer;

forming a second redistribution structure on the first filling layer, the second redistribution structure comprising a second conductive bump;

disposing a second semiconductor device on the second redistribution structure, wherein the second semiconductor device comprises a third conductive bump and a first solder material, the third conductive bump is disposed opposite to the second conductive bump, the first solder material is electrically connected between the second conductive bump and the third conductive bump, and the second redistribution structure is electrically connected between the first conductive bump and the second conductive bump; and disposing a bridge die on the second redistribution structure, wherein a vertical projection area of the bridge die and a vertical projection area of the first semiconductor device are partially overlapped.

15. The manufacturing method according to claim 14, wherein the first semiconductor device comprises a fourth conductive bump, the second redistribution structure comprises a fifth conductive bump, the bridge die comprises a sixth conductive bump and a second solder material, the sixth conductive bump is disposed opposite to the fifth conductive bump, the second solder material is electrically connected between the fifth conductive bump and the sixth conductive bump, and the second redistribution structure is electrically connected between the fourth conductive bump and the fifth conductive bump.

16. The manufacturing method according to claim 14, further comprising forming a conductive pillar on the first redistribution structure, the first filling layer surrounding the conductive pillar, and the conductive pillar being electrically connected between the first redistribution structure and the second redistribution structure.

17. The manufacturing method according to claim 14, wherein the first semiconductor device further comprises a through-silicon-via structure and a die bonding structure connected between the through-silicon-via structure and the first redistribution structure.

18. The manufacturing method according to claim 14, wherein the first semiconductor device has a first active side and a first backside, the second semiconductor device has a second active side and a second backside, the first conductive bump is disposed on the first active side, the third conductive bump is disposed on the second active side, and the first active side and the second active side are arranged in a face-to-face manner.

19. The manufacturing method according to claim 14, wherein the first semiconductor device has a first active side and a first backside, the second semiconductor device has a second active side and a second backside, the first conductive bump is disposed on the first backside, the third conductive bump is disposed on the second active side, and the first backside and the second active side are arranged in a face-to-face manner.

20. The manufacturing method according to claim 14, wherein a plurality of the first semiconductor devices are disposed on the second redistribution structure, and the bridge die provides an interconnect structure between two adjacent first semiconductor devices of the plurality of the first semiconductor devices.

* * * * *